(12) United States Patent
Kuroda

(10) Patent No.: US 6,811,618 B2
(45) Date of Patent: Nov. 2, 2004

(54) LIQUID PROCESSING APPARATUS AND METHOD

(75) Inventor: Osamu Kuroda, Tosu (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/304,749

(22) Filed: Nov. 27, 2002

(65) Prior Publication Data

US 2003/0098048 A1 May 29, 2003

(30) Foreign Application Priority Data

Nov. 27, 2001 (JP) ........................................ 2001-360781

(51) Int. Cl.[7] .............................................. B08B 3/02
(52) U.S. Cl. .................... 134/33; 134/148; 134/153; 134/902
(58) Field of Search ................................ 134/148, 153, 134/157, 902, 18, 33, 32

(56) References Cited

U.S. PATENT DOCUMENTS

| | | | |
|---|---|---|---|
| 4,788,994 A | * 12/1988 | Shinbara ..................... | 134/157 |
| 6,167,893 B1 | * 1/2001 | Taatjes et al. .............. | 134/147 |
| 6,374,834 B1 | * 4/2002 | Abe et al. ..................... | 134/1.3 |
| 6,578,853 B1 | * 6/2003 | Treur et al. .................. | 279/121 |

FOREIGN PATENT DOCUMENTS

JP          8-78368          3/1996

* cited by examiner

Primary Examiner—Michael Barr
Assistant Examiner—Saeed Chaudhry
(74) Attorney, Agent, or Firm—Smith, Gambrell & Russell, LLP

(57) ABSTRACT

In one embodiment of a liquid processing apparatus, a cleaning unit (CLN) 12 includes a rotary plate 61, supporting members 64a, holding members 64b, a chemical nozzle 51 for supplying a wafer W with a chemical liquid, a spring 120 and a pressing mechanism 121 both of which moves each of the holding members 64b. The pressing mechanism 121 moves the corresponding holding member 64b so that the wafer W is held by the holding members 64b while the wafer W is apart from the supporting members 64a and conversely, the wafer W is supported by the supporting members 64a while the wafer W is apart from the holding members 64b. The spring 120 holds the corresponding holding member 64b so that the wafer W is held by the holding members 64b while the wafer W is apart from the supporting members 64a. By supplying the wafer W held by the holding members 64b with the cleaning liquid, it is possible to prevent an occurrence of unprocessed portions on the cleaned wafer W, accomplishing a uniform cleaning for the wafer W.

20 Claims, 22 Drawing Sheets

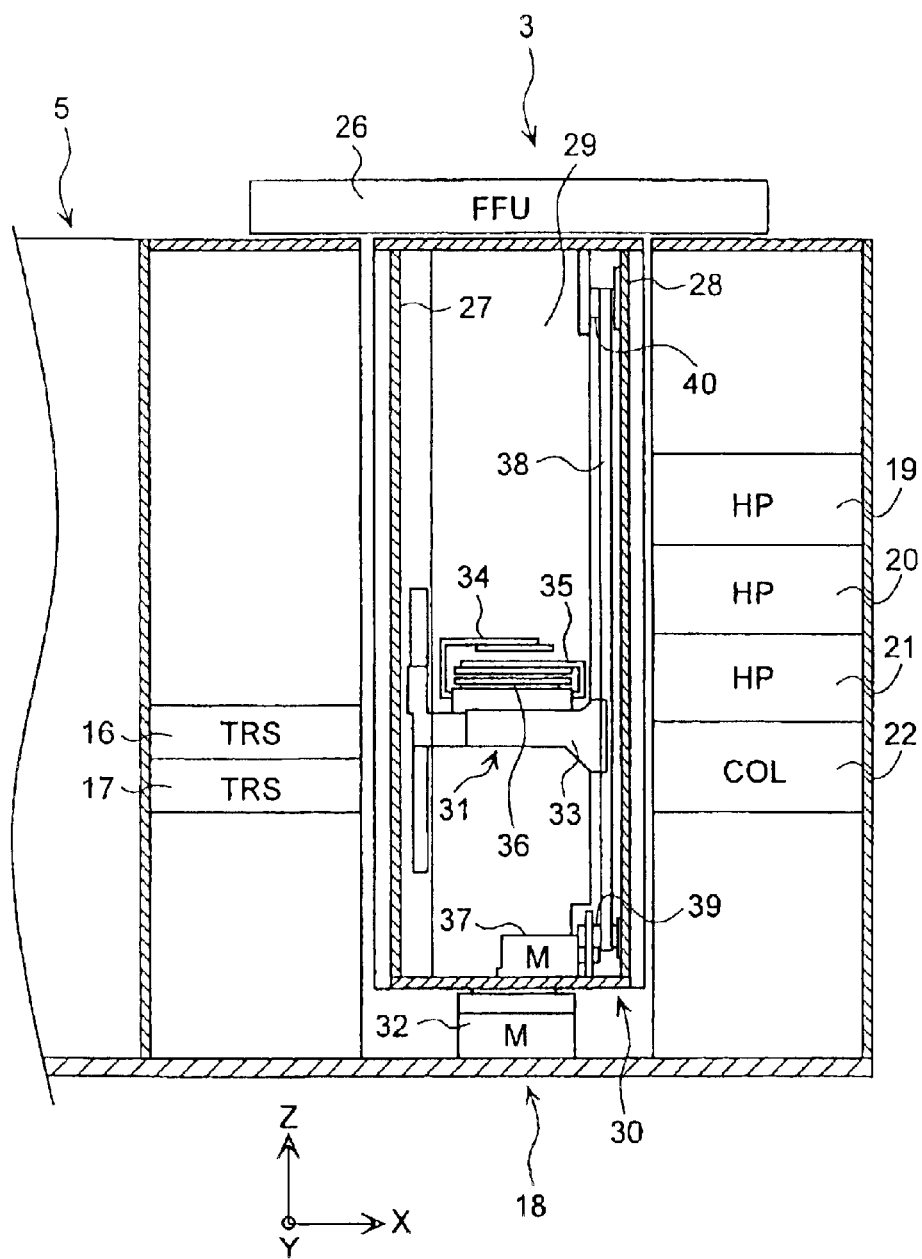
F I G. 3

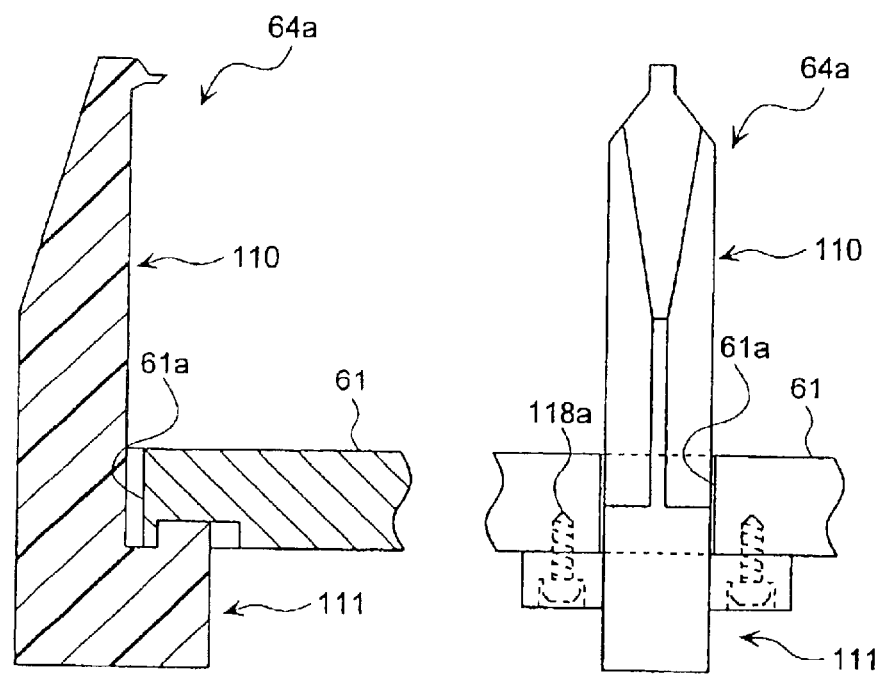
F I G. 6A   F I G. 6B
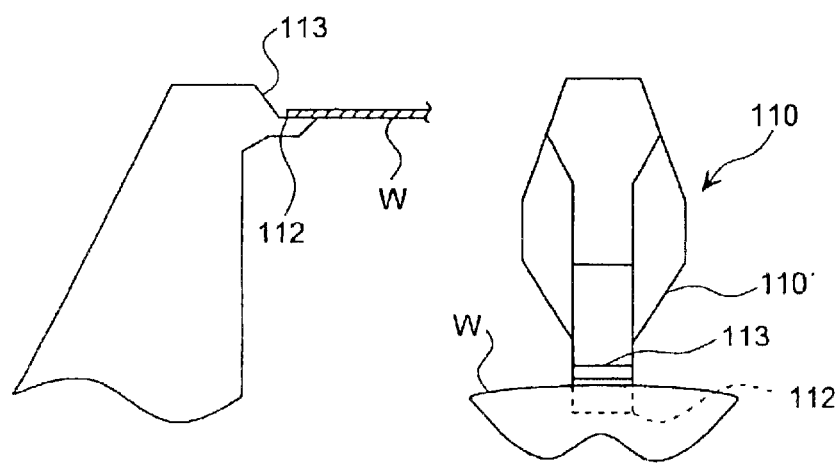
F I G. 7A   F I G. 7B

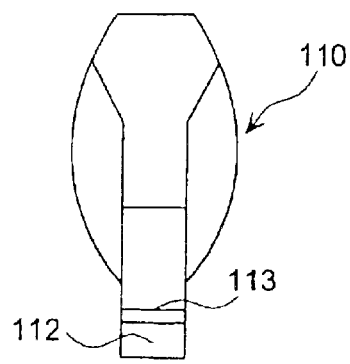
FIG. 8
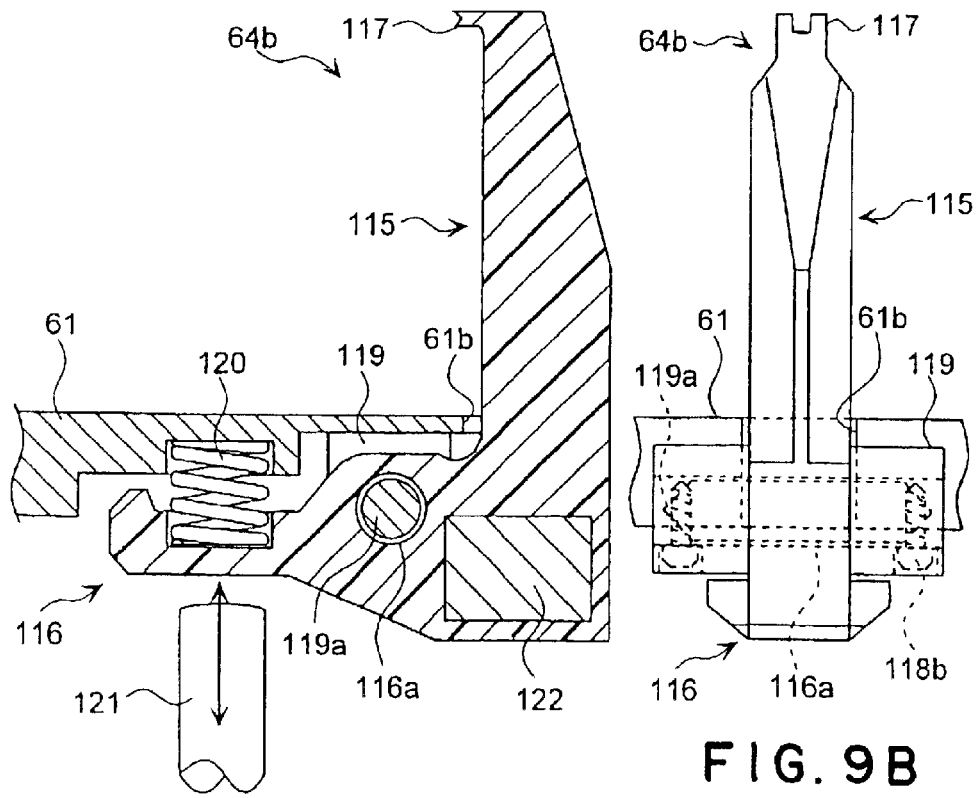
FIG. 9A
FIG. 9B

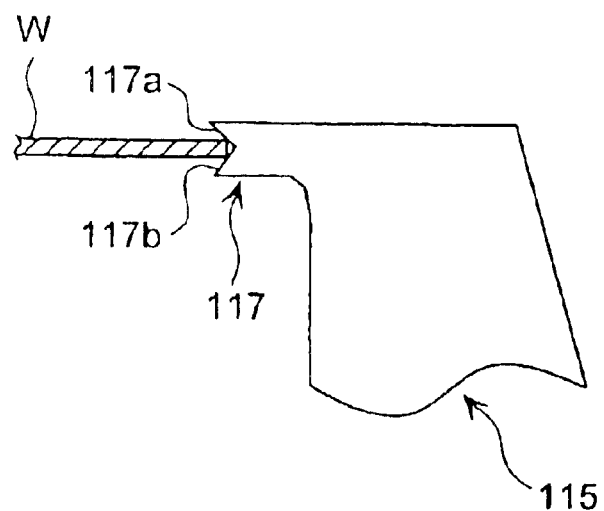
F I G. 10A
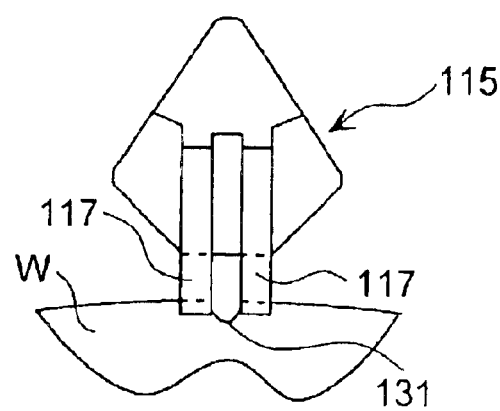
F I G. 10B

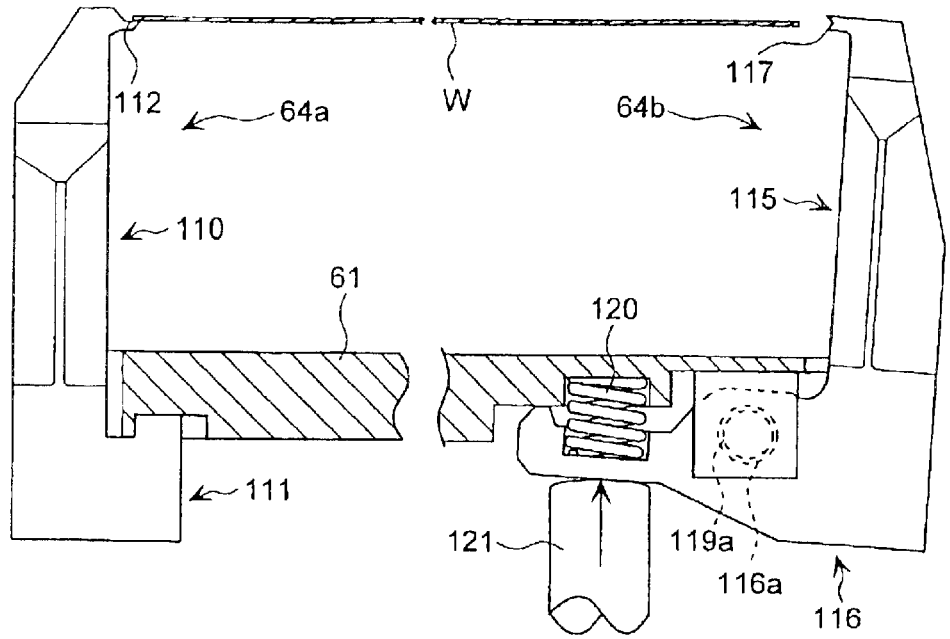
F I G. 12
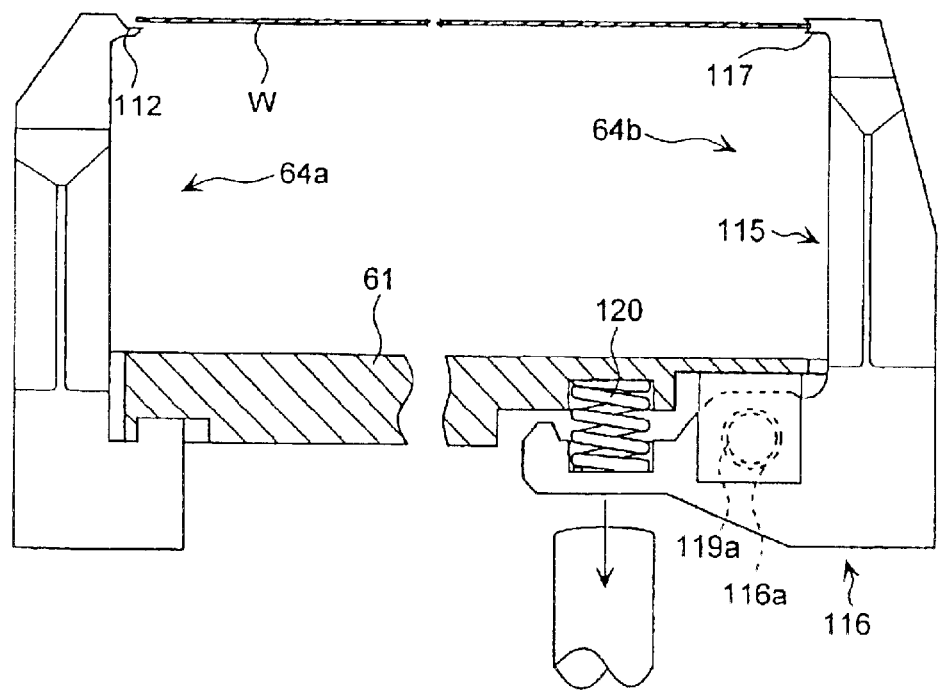
F I G. 13

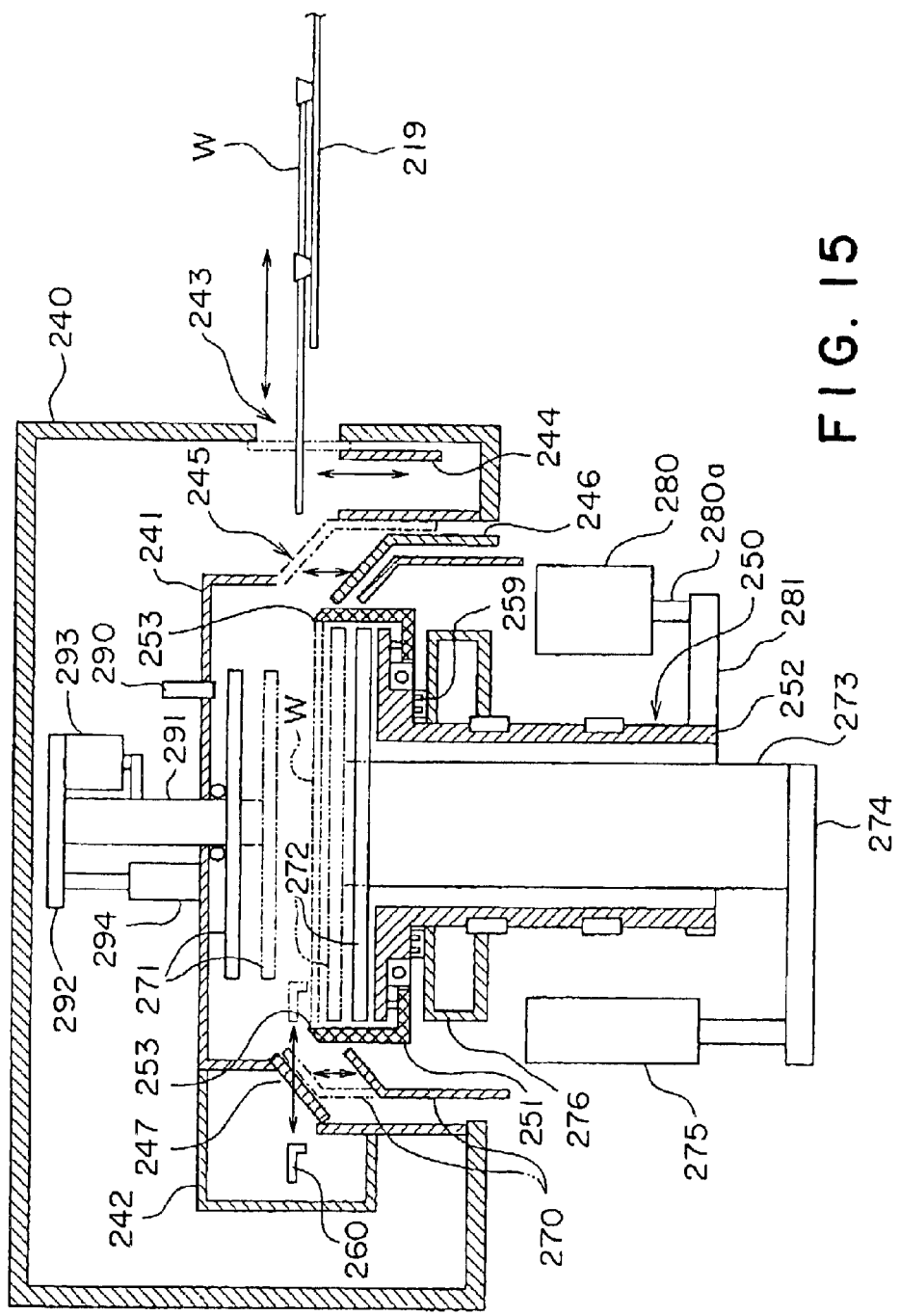
F I G. 15

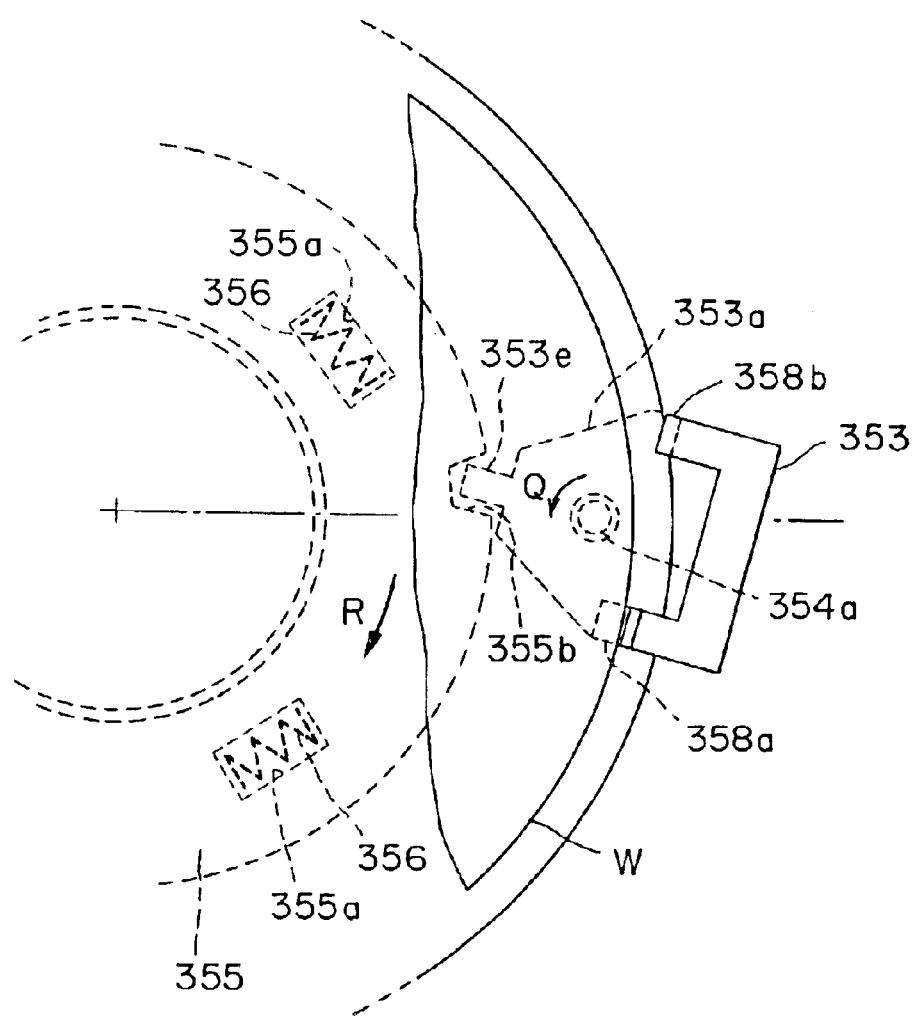
F I G. 24

LIQUID PROCESSING APPARATUS AND METHOD

BACKGROUND OF THE INVENTION

1. Technical Field of the Invention

The present invention relates to liquid processing apparatus and method by which a designated liquid processing is applied on a variety of substrates, for example, semiconductor wafer, LCD glass substrate, etc.

2. Description of the Related Art

In the manufacturing process of semiconductor devices, for example, there is used a cleaning system where a semiconductor wafer is cleaned to remove contaminations (particles, organic contaminants, metallic impurities, etc.) from the wafer and remove polymer etc. after an etching process by using a cleaning liquid, such as designated chemical liquid and deionized (pure) water.

As one wafer cleaning apparatus provided in the cleaning system, there is a known single-wafer type cleaning apparatus where a wafer is retained substantially horizontally and cleaned in rotation. For example, Japanese Patent Publication No. 8-78368 discloses a wafer cleaning apparatus where a wafer is supported by a plurality of support pins on a spin chuck and additionally, a cleaning liquid is supplied to the front face of the wafer and also a clearance between the wafer and the spin chuck, thereby cleaning both sides of the wafer simultaneously.

In the cleaning apparatus disclosed in Japanese Patent Publication No. 8-78368, however, there is a problem of insufficient cleaning since the cleaning liquid cannot spread up to wafer's portions in abutment with the support pins.

SUMMARY OF THE INVENTION

Under the above-mentioned situation, an object of the present invention is to provide liquid processing apparatus and method by which it becomes possible to prevent an occurrence of unprocessed portions on a substrate subjected to a liquid processing.

In order to accomplish the above object, there is provided, according to an invention stated in claim 1, a liquid processing apparatus for applying a liquid processing on a substrate by a processing liquid, comprising: supporting device for supporting the substrate substantially horizontally; holding device for holding an end face of the substrate and moving the substrate to and from the supporting device, the holding device being capable of holding the substrate substantially horizontally while the substrate is away from and above the supporting device by a predetermined distance; and processing-liquid supply unit for supplying the substrate held by the holding device with a processing liquid.

According to an invention stated in claim 2, there is also provided a liquid processing apparatus for applying a liquid processing on a substrate by a processing liquid, comprising: a rotary plate capable of rotation; a supporting member arranged on the rotary plate to substantially horizontally support the substrate at a predetermined position of the periphery of the substrate; a holding member arranged on the rotary plate to hold the substrate substantially horizontally; processing-liquid supply unit for supplying the substrate held by the holding member with a processing liquid; a driving mechanism for moving the holding member so that the substrate, which has been supported by the supporting member, can be held apart from the supporting member by the holding member and that the substrate, which has been held by the holding member, can be supported apart from the holding member by the supporting member; and a holding mechanism for holding the holding member at a predetermined position so that the substrate is held apart from the supporting member by the holding member.

According to an invention stated in claim 3, the holding member is provided with a claw part which holds an end face of the substrate, and the claw part has wall portions each inclined to the substrate with a predetermined angle, the wall portions being adapted to abut on circumferential edges of the substrate obliquely from its upside and downside respectively, in a manner that the circumferential edges of the substrate are pinched between the wall portions.

According to an invention stated in claim 4, the claw parts are arranged in two positions of the holding member apart from each other in a horizontal direction.

According to an invention stated in claim 5, the claw part is adapted so that the lower wall portion receives one of the circumferential edges of the substrate when the substrate is moved between the supporting member and the holding member, and the claw part is adapted so that the upper wall portion and the lower wall portion pinch the circumferential edges of the substrate when the substrate is away from the supporting member.

According to an invention stated in claim 6, the holding member comprises a main body formed to project from the rotary plate upward, the main body being provided, at a tip thereof, with the claw part and a base part arranged on the underside of the main body, the base part being connected with the main body; the holding mechanism includes a connecting member formed on a lower face of the rotary plate to connect the base part with the rotary plate so that the holding member can rotate with a predetermined angle and a spring disposed between the base part and the rotary plate to hold the holding member at a position and provide the claw part with a predetermined force for holding the substrate; and the driving mechanism includes a pressing member to press the base part toward the rotary plate thereby releasing the predetermined force for holding the substrate, the predetermined force being applied on the claw part by the spring.

According to an invention stated in claim 7, the holding member is formed to have a center of gravity in level with a rotating center of the holding member under condition that the claw part holds the substrate.

According to an invention stated in claim 8, the base part is provided, inside thereof, with a weight member for adjusting the position of a center of gravity of the holding member, the weight member having a specific gravity larger than a specific gravity of the other portion of the base part.

According to an invention stated in claim 9, the main body has side faces each tapered with a predetermined angle or curved in plan view, thereby reducing an air resistance exerted to the main body when the rotary plate is rotated.

According to an invention stated in claim 10, the supporting member includes a supporting part for contact with the back face of the substrate and a wall part having a predetermined height to guide a circumferential end face of the substrate supported by the supporting part; and the holding member is adapted so as to hold the substrate in a position where the back face of the substrate is away from the supporting part of the supporting member and where a level of the back face of the substrate is lower than the top of the wall part of the supporting member.

According to an invention stated in claim 11, the rotary plate is provided, in a periphery thereof and at designated positions about the periphery, with notches in which the supporting member and the holding member are provided.

According to an invention stated in claim 12, the liquid processing apparatus further comprises: a first plate arranged apart from the back face of the substrate in a predetermined distance so as to be substantially parallel with the back face of the substrate held by the holding member; and a second plate which is movable up and down thereby occupying a position where the second plate is arranged apart from the front face of the substrate in a predetermined distance so as to be substantially parallel with the front face of the substrate held by the holding member, wherein the processing-liquid supply unit can supply the processing liquid into a clearance defined between the first plate and the back face of the substrate and another clearance defined between the second plate and the front face of the substrate.

According to an invention stated in claim 13, there is also provided a liquid processing apparatus for applying a liquid processing on a substrate by a processing liquid, comprising: a rotary plate capable of rotation; a holding-member body arranged on an outer periphery of the rotary plate, the holding-member body being rotatable about a rotating shaft in parallel with a rotating shaft of the rotary plate; a supporting part provided in the holding-member body to support the substrate at a predetermined position of a peripheral part of the substrate substantially horizontally; a pressing part provided in the holding-member body to press the outer periphery of the substrate supported by the supporting part inward in a radial direction thereof; a holding part provided in the holding-member body to hold the outer periphery of the substrate substantially horizontally; a processing-liquid supplying unit for supplying the substrate held by the holding part with a processing liquid; a fixing mechanism for fixing the holding-member body in a predetermined position so as to allow the substrate to be supported by the supporting part; an urging mechanism for rotating the holding-member body so that when releasing the fixing mechanism, the pressing member can press the substrate while the substrate is being supported by the supporting part; and a centrifugal weight for rotating the holding-member body by means of a centrifugal force so as to make the pressing part withdraw from the outer periphery of the wafer, make the holding part to engage with the outer periphery of the wafer and support the substrate being away from the supporting part.

According to an invention stated in claim 14, there is further provided a liquid processing apparatus for applying a liquid processing on a substrate by a processing liquid, comprising: a rotary plate capable of rotation; a holding-member body arranged on an outer periphery of the rotary plate, the holding-member body being rotatable about a rotating shaft in parallel with a rotating shaft of the rotary plate; a supporting part provided in the holding-member body to support the substrate at a predetermined position of a peripheral part of the substrate substantially horizontally; a holding part provided in the holding-member body to hold the substrate substantially horizontally; a processing-liquid supplying unit for supplying the substrate held by the holding part with a processing liquid; a driving mechanism for rotating the holding-member body so that the substrate that has been held by the holding part is supported by the supporting part while the substrate is being away from the holding part; and an urging mechanism for rotating the holding-member to a predetermined position so that the substrate that has been supported by the supporting part is held by the holding part while the substrate is being away from the supporting part.

According to an invention stated in claim 15, in the liquid processing apparatus, a position to allow the supporting part to support the substrate is higher than another position to allow the holding part to hold the substrate.

According to an invention stated in claim 16, the holding part has a groove formed to have a V-shaped section defined by two inclined faces; and the substrate is held in a manner that a ridgeline where the upper face of the substrate intersects the outer circumferential face of the substrate and another ridgeline where the lower face of the substrate intersects the outer circumferential face of the substrate come into contact with the inclined faces of the holding part, respectively.

According to an invention stated in claim 17, there is also provided a liquid processing method of applying a liquid processing on a substrate, the method comprising: a first process to allow a supporting member for supporting the substrate to support the substrate substantially horizontally; a second process to allow a holding member for holding the substrate to hold the substrate substantially horizontally while the substrate is being away from the supporting member; and a third process to supply the substrate held by the holding member with a processing liquid, thereby restraining an occurrence of unprocessed portions on the substrate, which might be caused since the supporting member abuts on the back face of the substrate.

According to an invention stated in claim 18, there is further provided a liquid processing method of applying a liquid processing on a substrate, the method comprising: a first process to allow a supporting member for supporting the substrate to support the substrate substantially horizontally; a second process to allow a holding member for holding the substrate to hold the substrate substantially horizontally while the substrate is being away from the supporting member; a third process to arrange a plate member so as to be substantially parallel with the back face of the substrate held by the holding member, at a predetermined distance; a fourth process to supply a gap between the back face of the substrate held by the holding member and the plate member with a processing liquid; and a fifth process to rotate the substrate held by the holding member, at a predetermined rotating speed, thereby restraining an occurrence of unprocessed portions on the substrate, which might be caused since the supporting member abuts on the back face of the substrate.

According to an invention stated in claim 19, in the above method, the fourth process includes the steps of: forming a paddle of the processing liquid between the back face of the substrate held by the holding member and the plate member; and retaining the paddle therebetween for a predetermined period.

According to an invention stated in claim 20, the third process further includes the step of arranging another plate member so as to be substantially parallel with the front face of the substrate held by the holding member, at a predetermined distance; and the fourth process further includes the step of supplying a gap between the front face of the substrate held by the holding member and the other plate member with a processing liquid.

According to the liquid processing apparatuses and methods mentioned above, it is possible to prevent an occurrence of unprocessed portions on the substrate due to insufficient diffusion of the processing liquid. Because the liquid processing can be performed on condition of not supporting the substrate but holding a circumferential end face thereof. In conclusion, it is possible to establish a uniform liquid processing for the substrate.

The above and other features and advantages of this invention will become apparent, and the invention itself will best be understood, from a study of the following description and appended claims, with reference had to the attached drawings showing preferred embodiments of the invention.

BRIEF DESCRIPTION OF THE DRAWINGS

FIG. 3 is a schematic sectional view of the cleaning system of FIG. 1;

FIG. 6A is a sectional view showing the shape of a support member and its attaching state to a rotary plate, and FIG. 6B is a rear view of FIG. 6A;

FIG. 7A is a side view enlarging a strut part of the support member, and FIG. 7B is a plan view of FIG. 7A;

FIG. 8 is a plan view of another embodiment of the strut part of the support member;

FIG. 9A is a sectional view of the shape of a holding member and the member's attachment to the rotary plate, and FIG. 9B is a rear view of FIG. 9A;

FIG. 10A is a side view enlarging a strut part of the holding member, and FIG. 10B is a plan view of FIG. 10A;

FIG. 12 is an explanatory view showing the supporting member supporting a wafer;

FIG. 13 is an explanatory view showing the holding member holding the wafer;

FIG. 15 is a sectional view showing the substrate cleaning unit and the spin chuck;

FIG. 24 is a plan view showing a first holding part projecting inward in the radial direction of the spin chuck of FIG. 23;

DESCRIPTION OF THE PREFERRED EMBODIMENT

With reference to drawings, embodiments of the present invention will be described in detail, below. Descriptions are made by example of the application of the present invention on a cleaning unit which is included in a cleaning system that carries out loading of wafers, cleaning/drying of the wafers and unloading of the processed wafers in succession and which is capable of cleaning both sides of each wafer simultaneously.

FIGS. 1 to 13 are views of the first embodiment of the invention.

Figure 1:
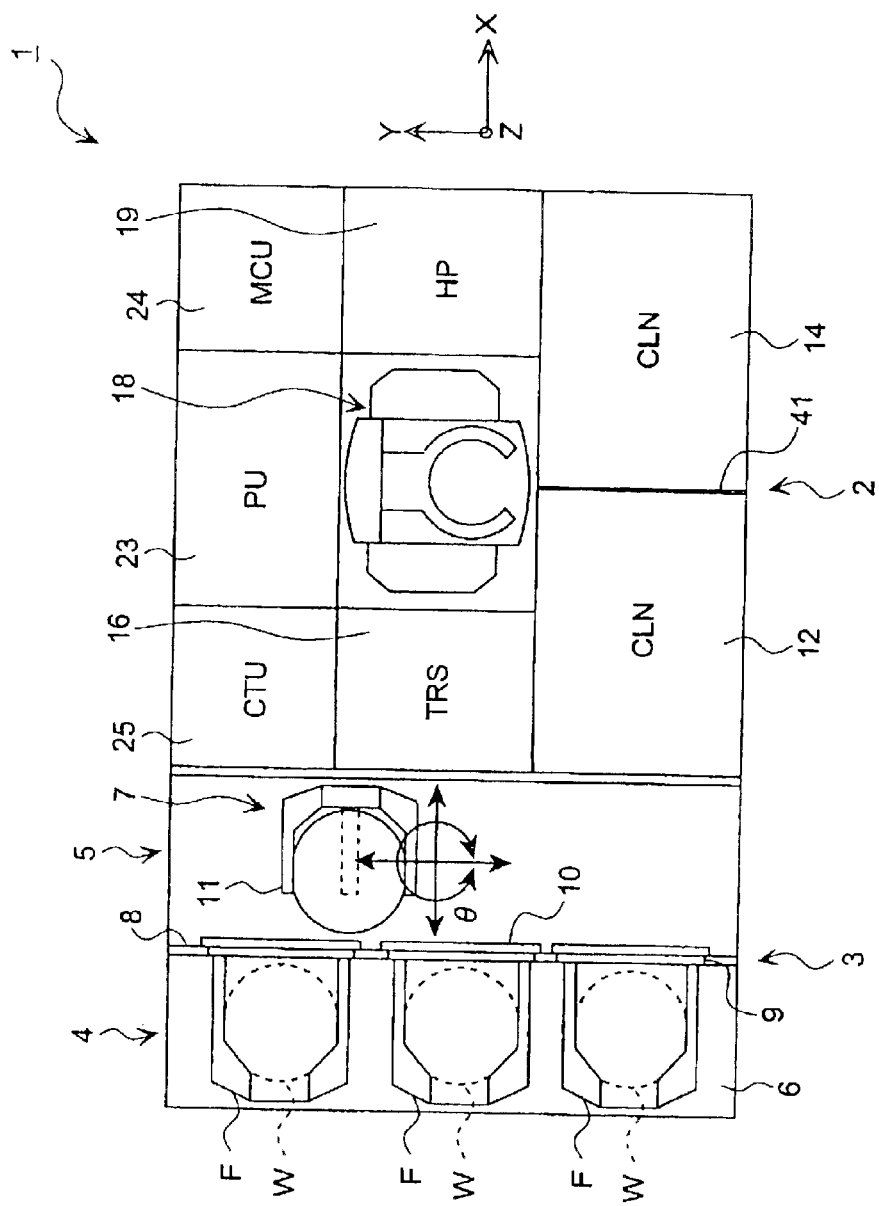
FIG. 1 is a plan view of the schematic structure of a cleaning system equipped with a cleaning apparatus in accordance with a first embodiment of the present invention.
Figure 2:
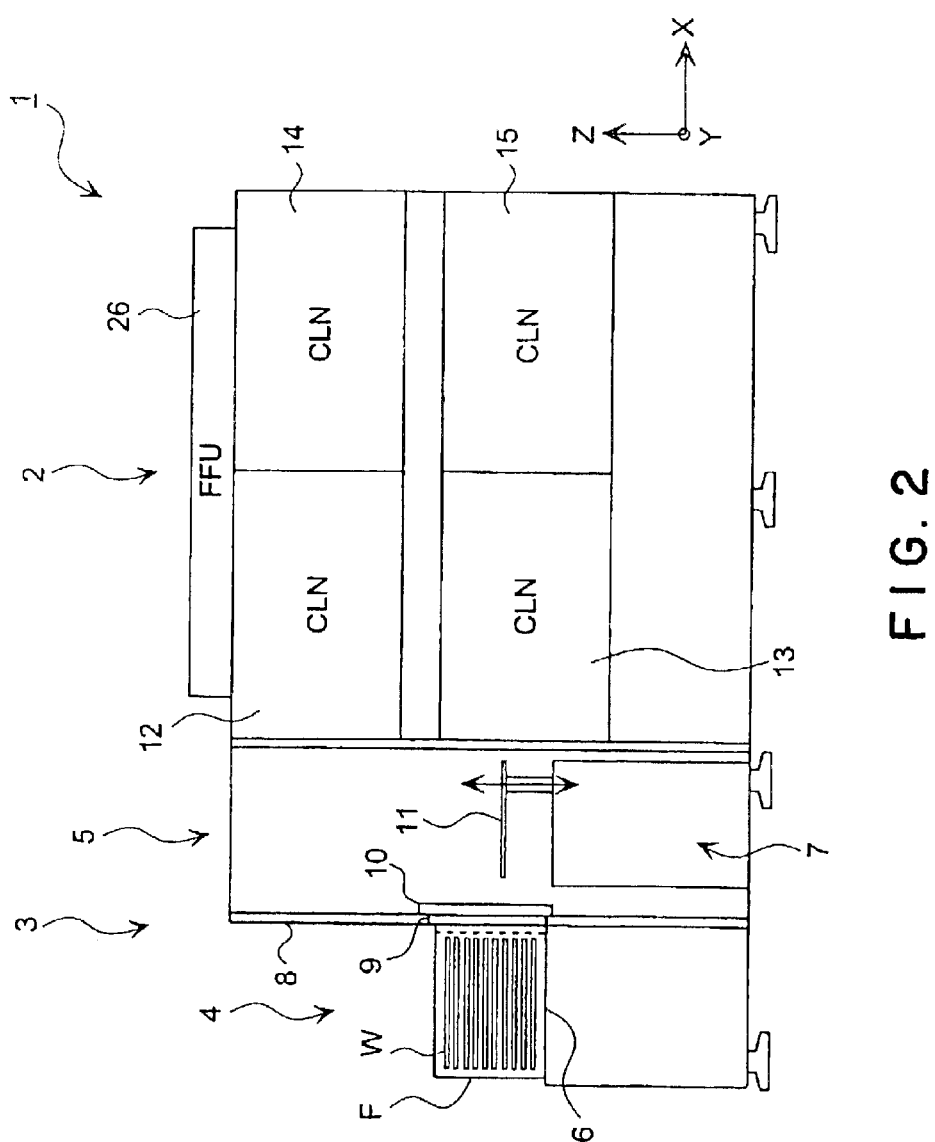
FIG. 2 is a side view showing the schematic structure of the cleaning system of FIG. 1.

FIG. 1 is a plan view showing the schematic structure of a cleaning system 1 and FIG. 2 is a side view of the cleaning system 1. The cleaning system 1 is formed by a cleaning section 2 for carrying out cleaning of a wafer W and subsequent heat-processing thereof, and a loading/unloading section 3 for loading the wafer W to the cleaning section 2 and unloading the wafer W from the cleaning section 2. The loading/unloading section 3 is formed by an in/out port 4 having a mounting table 6 for mounting carriers F each capable of accommodating a plurality of wafers W (e.g. twenty-five wafers), and a wafer transporting section 5 carrying out delivery of the wafer W between the carrier F and the cleaning section 2. Noted that the carrier F will be called "FOUP" (front opening unified pod) in the specification, hereinafter.

The FOUP F is constructed so as to allow the wafers W to be transferred through one lateral side of the FOUP F. Again, the FOUP F is provided, on this lateral side, with a closing lid body. Shelf plates are formed on an inner wall of the FOUP F to retain the wafers W at predetermined intervals, defining twenty-five slots for accommodating the wafers W. The wafers W are accommodated in the slots one by one on condition that respective front faces of the wafers W (on which semiconductor devices are to be formed) direct upward in the slots respectively.

On the mounting table 6 of the in/out port 4, a plurality of FOUPs F (e.g. three FOUPs) are juxtaposed along a direction of Y at designated positions. Each FOUP F is arranged so as to direct its one side having the lid body toward a boundary wall 8 between the in/out port 4 and the wafer transporting section 5. The boundary wall 8 has windows 9 formed in respective wall's positions corresponding to the FOUPs F mounted on the table 6. On one side of each window 9 facing the wafer transporting section 5, a shutter 10 is arranged to close the corresponding window 9.

The shutters 10 are adapted so as to open and close the lid bodies of the FOUPs F, respectively. Simultaneously with both opening action and closing action of each window 9, the shutter 10 opens and closes the lid body of the corresponding FOUP F. In view of avoiding operating the shutter 10 unless the FOUP F is arranged in its designated position on the mounting table 6, preferably, each shutter 10 is provided with an interlock mechanism. When the window 9 is opened to communicate the wafer loading/unload port with the wafer transporting section 5, a wafer transporting unit 7 in the section 7 becomes possible to get access to the FOUP F, allowing the wafer W to be transported. On the upside of each window 9, a not-shown wafer-inspecting unit is arranged to inspect the wafers W accommodated in the FOUP F, in terms of their number and conditions every slot. Alternatively, each shutter 10 may be equipped with the above wafer-inspecting unit.

The wafer-transporting unit 7 in the wafer transporting section 5 is movable in the direction Y. The wafer-transporting unit 7 includes a sub-transporting arm 11 for holding the wafer W. The sub-transporting arm 11 is slidable in a direction of X and is movable up and down in a direction of Z and further rotatable in a plane X-Y (θ-direction). Thus, it is possible to move the wafer transporting unit 7 to a position facing an optional FOUP F mounted on the mounting table 6 and also possible to make the sub-transporting arm 11 get access to one slot at an optional height in the opposing FOUP F. Additionally, it is possible to move the wafer transporting unit 7 to positions opposing two wafer transfer units (TRS) 16, 17 in the cleaning section 7, allowing the sub-transporting arm 11 to get access to the wafer transfer units (TRS) 16, 17. The position of the wafer transfer unit (TRS) 17 is illustrated in FIG. 3. That is, the wafer transporting unit 7 carries out loading and unloading of the wafers W against the FOUPs F and further transfers the wafers W from the cleaning section 2 to the loading/unloading section 3 and conversely, from the loading/unloading section 3 to the cleaning section 2.

The cleaning section 2 includes two wafer transfer units (TRS) 16, 17 for mounting the wafers W thereon temporarily in order to deliver the wafers W between the cleaning section 2 and the wafer transporting section 5, four cleaning units (CLN) 12, 13, 14, 15 for cleaning both sides of each wafer W simultaneously, three hot plate units (HP) 19, 20, 21 for heating the wafers W after cleaning, a cooling unit (COL) 22 for cooling the heated wafers W and a main wafer transporting unit 18 for carrying out the delivery of the wafers w among these units. Respective positions of the hot plate units (HP) 20, 21 and also the cooling unit (COL) 22 are illustrated in FIG. 3 similarly.

The cleaning section 2 further includes a power unit (PU) 23 for driving the whole cleaning system 1, a mechanical control unit (MCU) 24 for controlling the operations of respective units forming the cleaning system 1 and the operation of the whole cleaning system 1 and a chemical tank unit (CTU) 25 for storing a designated cleaning liquid to be supplied to the cleaning units (CLN) 12 to 15. The power unit (PU) 23 is connected with a not-shown main power source. The cleaning section 2 is provided, on a ceiling thereof, with a filter fan unit (FFU) 26 which allows fresh air to flow into the respective units and the main wafer transporting unit 18 downward.

Note, by either arranging the chemical tank unit (CTU) 25, the power unit (PU) 23 and the mechanical control unit (MCU) 24 outside the cleaning section 2 or withdrawing these units therefrom, it is possible to carry out the maintenance of the wafer transfer units (TRS) 16, 17, the main wafer transporting unit 18 and the hot plate units (HP) 19 to 21 and the cooling unit (COL) 22 from the side of this plane (a lateral face in the direction Y) with ease.

FIG. 3 is a sectional view showing the schematic arrangement of the wafer transfer units (TRS) 16, 17, the main wafer transfer unit 18 adjacent to the units 16, 17 in the direction X, the hot plate units (HP) 19 to 21 and the cooling unit (COL) 22. The wafer transfer units (TRS) 16, 17 are piled up and down. For example, the wafer transfer unit (TRS) 17 on the lower stage is used to mount a wafer W to be transported from the wafer transporting section 3 to the cleaning section 2. While, the wafer transfer unit (TRS) 17 on the upper stage is used to mount a wafer W to be transported from the cleaning section 2 to the wafer transporting section 3.

The downward flow discharged from the fan filter unit (FFU) partially passes through the wafer transfer units (TRS) 16, 17 and their upside space and flows out toward the wafer transporting section 5. Consequently, it becomes possible to prevent particles etc. in the wafer transporting section 5 from invading the cleaning section 2, thereby maintaining cleanness in the cleaning section 2.

The main wafer-transporting unit 18 includes a cylindrical supporting body 30 and a wafer transporting body 31. The cylindrical supporting body 30 has vertical walls 27, 28 extending in the direction Z and a lateral opening 29 between the walls 27, 28. The wafer transporting body 31 is arranged inside the cylindrical supporting body 30. The body 31 is adapted so as to be movable in the direction Z along the cylindrical supporting body 30. The cylindrical supporting body 30 is rotatable by a rotational driving force of a motor 32. Correspondingly, the wafer transporting body 31 is rotatable in one body with the body 30.

The wafer transporting body 31 includes a transporting base 33 and three main transporting arms 34, 35, 36 movable along the base 33 in front and back. The main transporting arms 34, 35, 36 are formed with respective sizes allowing their passage through a side opening 29 of the cylindrical support 30. These main transporting arms 34, 35, 36 are capable of moving in front and back independently of each other since motors and corresponding belt mechanisms (both not shown) are included in the transporting base 33. The wafer transporting body 31 moves up and down when a motor 37 drives a belt 38. Reference numeral 39 denotes a driving pulley, while reference numeral 40 denotes a driven pulley.

On the cooling unit (COL) 22 for cooling the wafer W forcibly, there are stacked up three hot plate units (HP) 19 to 21. Noted that there may be arranged the hot plate units (HP) 19 to 21 and the cooling unit (COL) 22 in a space above the wafer transfer units (TRS) 16, 17, alternatively. Then, a space occupied with the hot plate units (HP) 19 to 21 and the cooling unit (COL) 22 of FIGS. 1 and 3 can be utilized as another utility space.

The cleaning units (CLN) 12 to 15 are arranged in upper and lower stages, i.e. two units for each stage. The cleaning unit (CLN) 12 and the cleaning unit (CLN) 14 have respective structures symmetrical to each other with respect to a wall face 41 forming a boundary between the units 12, 14. This arrangement is also applicable to the cleaning (CLN) unit 13 and the cleaning unit 15. The cleaning units 12 to 15 have structures similar to each other, in terms of constituent members and their functions. Therefore, the structure of the cleaning unit (CLN) 12 will be described in detail, representatively.

Figure 4:
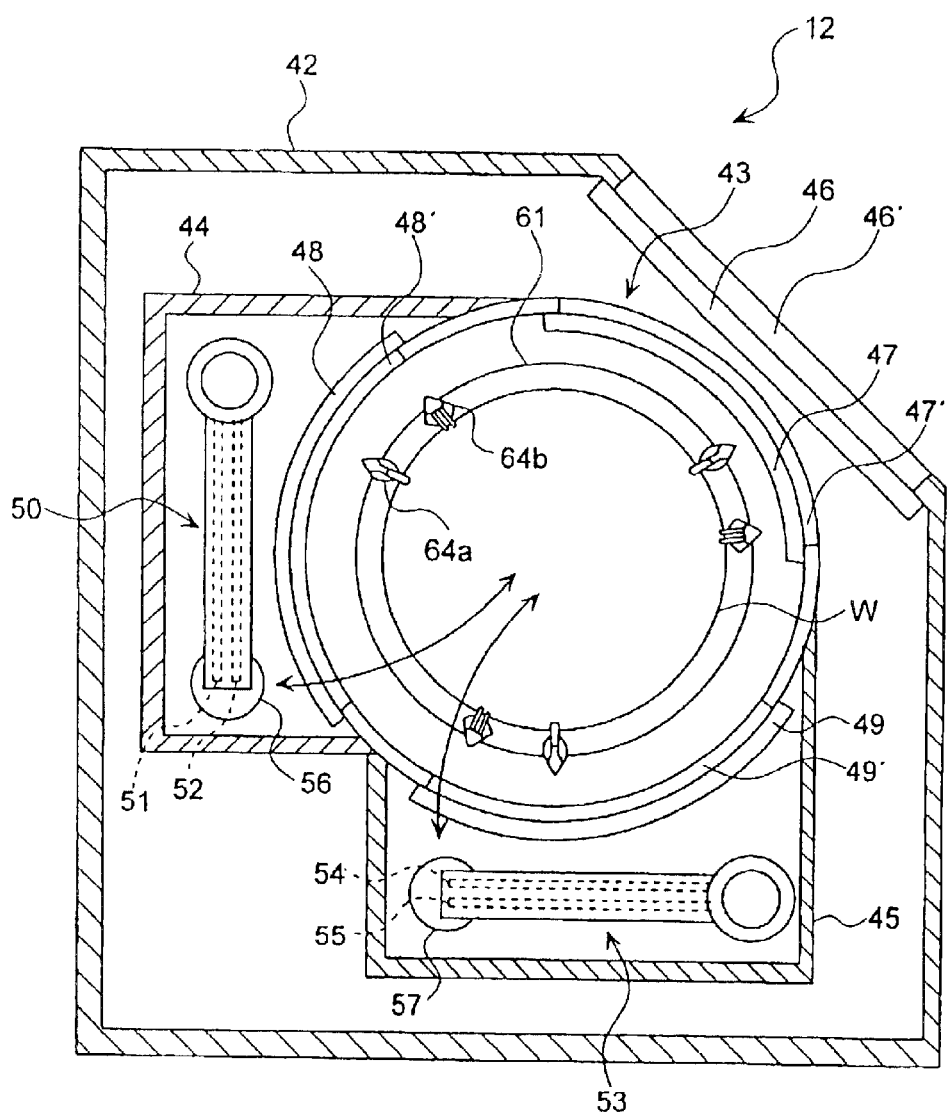
FIG. 4 is a plan view of the schematic structure of a cleaning unit.
Figure 5:
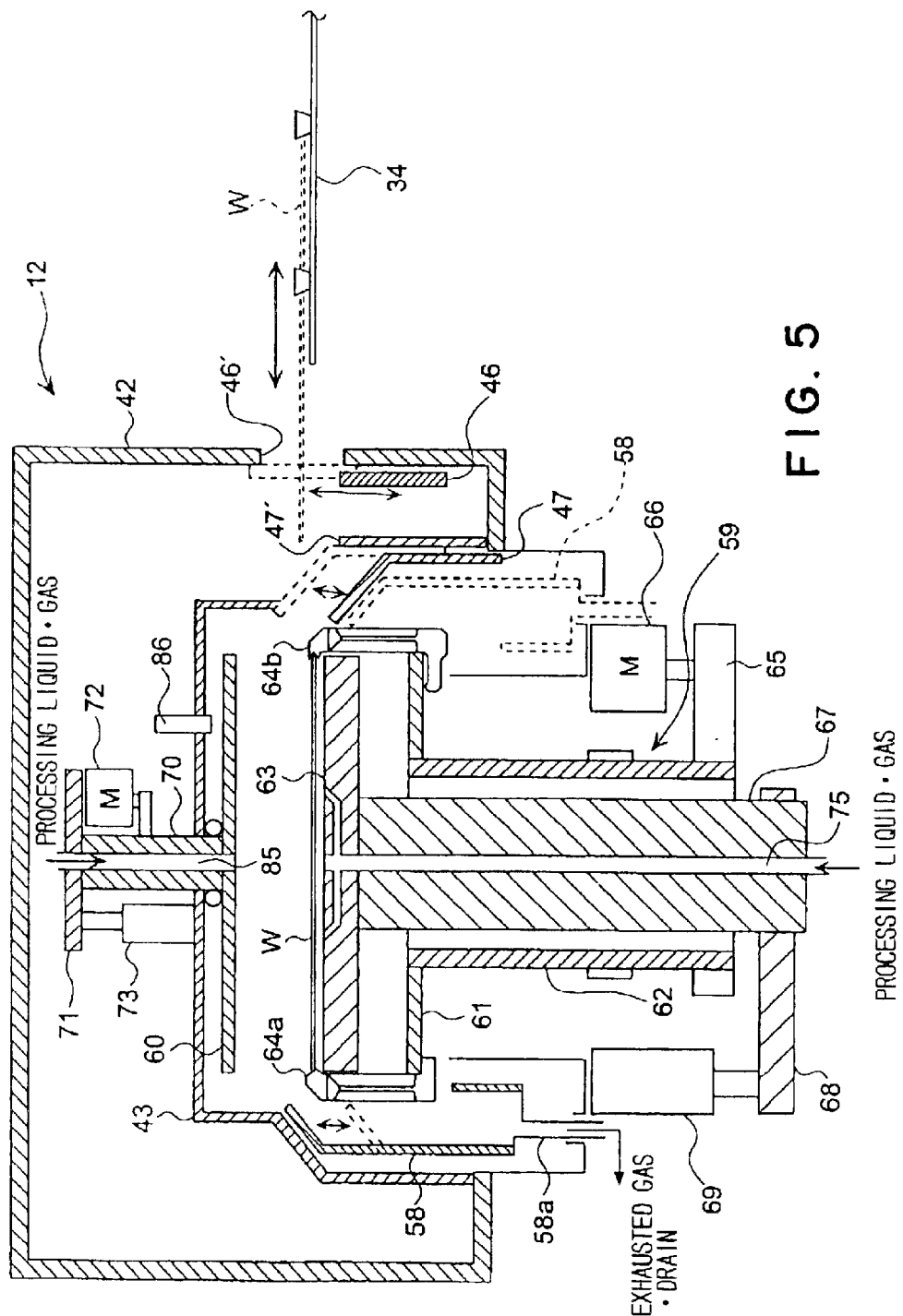
FIG. 5 is a sectional view of the schematic structure of the cleaning unit.

FIG. 4 is a schematic plan view of the cleaning unit 12 and FIG. 5 is a schematic sectional view of the same unit 12. The cleaning unit 12 has a housing 42 in which an outer chamber 43, a chemical arm housing 44 and a rinsing/drying arm housing 45 are arranged respectively.

The housing 42 is provided with an opening 46' to be closed by a first shutter 46. FIGS. 4 and 5 do not illustrate a mechanism for driving the first shutter 46. The main transporting arm 34 (or 35, 36) transfers the wafer W to and from the cleaning unit (CLN) 12 through the window 46'. Except the loading and unloading operations of the wafer W, the window 46' is closed by the first shutter 46. Noted that the first shutter 46 is adapted so as to close and open the window 46' on the inside of the housing 42. With this structure, it is possible to prevent an atmosphere inside the housing 42 from leaking out in case of a positive pressure in the housing 42.

The cleaning process of the wafer W is carried out in the outer chamber 43. The outer chamber 43 is provided with a window 47'. This window 47' can be closed by a second shutter 47 movable by a not-shown cylinder driving mechanism or the like. The main transporting arm 34 (or 35, 36) moves into and from the outer chamber 43 through the window 47' to carry out delivery of the wafer W against a spin chuck 59 in the outer chamber 43. Except to deliver the wafer W, the window 47' is closed by the second shutter 47. Since the second shutter 47 is adapted so as to close and open the window 47' on the inside of the outer chamber 43, it is possible to prevent an atmosphere inside the chamber 43 from leaking out even if a positive pressure is formed in the outer chamber 43. Note that a common driving mechanism may actuate the first shutter 46 and the second shutter 47 in order to allow the windows 46', 47' to be opened or closed simultaneously.

The outer chamber 43 is provided, on a top wall thereof, with a gas supply mechanism 86 for supplying the outer chamber 43 with nitrogen ($N_2$) gas. This gas supply mechanism 86 forms a downward flow of nitrogen gas in the outer chamber 43 to perform a role to prevent a chemical liquid supplied to the wafer W held by the spin chuck 59 from evaporating and filling in the outer chamber 43. Further, owing to the formation of downward flowing in the chamber 43, it is possible to reduce the possibility of generating watermarks on the surface of the wafer W.

In the outer chamber 43, there are a processing cup 58 for accommodating the wafer W therein, the spin chuck 59 for holding the wafer W in the processing cup 58, an under plate 63 capable of opposing the back side of the wafer W, which is held by the spin chuck 59, through a predetermined interval, and a top plate 60 capable of opposing the front side of the wafer W held by the spin chuck 59, through another predetermined interval.

The processing cup 58 is provided, on its upper part, with a tapered portion. A drain 58a is formed on the bottom wall of the cup 58. The processing cup 58 is movable up and down between an upper position (i.e. position with a solid line of FIG. 5: "processing position" hereinafter) where the top of the cup 58 is positioned above the wafer W held by the spin chuck 59 and the tapered part of the cup 58 surrounds the wafer W and a lower position (i.e. position with a broken line of FIG. 5: "withdrawal position" hereinafter) where the top of the cup 58 is positioned under the wafer W held by the spin chuck 59.

When the wafer W is transferred between the main transporting arm 34 and the spin chuck 59, the processing cup 58 is held at the withdrawal position so as not to interrupt entering and withdrawal of the main transporting arm 34. On the other hand, when applying a liquid processing on the wafer W held by the pin chuck 59, the processing cup 58 is held at the processing position to prevent a cleaning liquid supplied to the wafer W from being scattered in the circumference. Additionally, the processing cup 58 also serves to introduce the cleaning liquid that has been used for cleaning the wafer W, into the drain 58a. The drain 58a is connected with a cleaning-liquid recovery line and an exhaust duct both not shown in the figure. With the connection, it is possible to prevent mist etc. produced in the processing cup 58 from spreading into the outer chamber 43 and simultaneously, the used cleaning liquid is collected or drained.

The spin chuck 59 includes a rotary plate 61 and a rotating cylinder 62 connected to the rotary plate 61. Supporting members 64a for supporting the wafer W and holding members 64b are attached to the periphery of the rotary plate 61. In view of supporting the wafer W certainly, it is preferable to arrange the supporting members 64a at least three positions. Similarly, it is also preferable to arrange the holding members 64b at least three positions in view of holding the wafer W certainly. A belt 65 is wound around the outer circumference of the rotating cylinder 62. The circumferential drive of the belt 65 by means of a motor 66 allows the rotating cylinder 62 and the rotary plate 61 to be rotated together with the wafer W held by the holding members 64b.

FIG. 6A is a sectional view showing the profile of the supporting member 64a being attached to the rotary plate 61 and FIG. 6B is a rear view of FIG. 6A. The supporting member 64a includes a column part 110 projecting from the rotary plate 61 upward and a base part 111 arranged below the column part 110 and also formed in one body therewith. The rotary plate 61 is provided, on its periphery, with notches 61a each having a size for engagement with the column part 110, thereby reducing a projection of the column part 110 from the outer circumference of the rotary plate 61 (see FIG. 4). Consequently, in case of rotating the rotary plate 61 at a high speed, it is possible to restrain the rotary plate 61 from being bent by a centrifugal force applied on the support member 64a. The base part 111 is fixed to the backside of the rotary plate 61 by means of screws 118a.

FIG. 7A is a side view of the column part 110 and FIG. 7B is a plan view of the column part 110. The column part 110 is provided, on its upper part, with a supporting part 112 which is brought into abutment with the back side of the wafer W to support it, and a wall part 113 of a predetermined height, which serves to guide an end face of the wafer W supported on the supporting part 112. As shown in FIGS. 4, 5 and 7B, both side faces 111' of the column part 110 are tapered in plan view to reduce its air resistance during the rotation of the rotary plate 61.

Alternatively, as shown in FIG. 8, it is also preferable that the side faces 111' of the column part 110 are curved in plan view. Since this formation of the side faces 111' allows air resistance during the rotation of the plate 61 to be reduced similarly, it is possible to lighten a burden on the motor thereby restraining an occurrence of loud noise.

FIG. 9A is a sectional view showing the profile of the holding member 64b being attached to the rotary plate 61 and FIG. 9B is a rear view of FIG. 9A. The holding member 64b includes a column part 115 projecting from the rotary plate 61 upward and a base part 116 positioned below the column part 115 and also connected therewith. The rotary plate 61 is provided, on its periphery, with notches 61b each having a size for engagement with the column part 115, thereby reducing a projection of the column part 115 from the outer circumference of the rotary plate 61 (see FIG. 4). Consequently, in case of rotating the rotary plate 61 at a high speed, it is possible to restrict the rotary plate 61 from being bent by a centrifugal force applied on the holding member 64b.

At the tip of the column part 115, two claw parts 117 are formed to hold the end face of the wafer W, at a predetermined interval. A through-hole 116a is formed in the base part 116. A metal block 122 is embedded in the base part 116. The metal block 122 has a function to adjust a center of gravity of the column part 115 and the base part 116, which will be described later.

FIG. 10A is a side view of the column part 115 and FIG. 10B is a plan view of the column part 115. The claw part 117 has a pair of wall portions 117a, 117b inclined to a horizontal plane (or the surface of wafer W) at predetermined angles, respectively. The upper wall portion 117a is adapted so as to abut on the front edge of the wafer W obliquely from its upside. While, the lower wall portion 117b is adapted so as to abut on the back edge of the wafer W obliquely from its downside. The wafer W is held by the column part 115 while being pinched by a groove defined by these wall portions 117a, 117b. Owing to such a holding form by the wall portions 117a, 117b, it is possible to prevent the wafer W from moving up and down. When holding the wafer W, the above groove defined by the wall portions 117a, 117b is positioned higher than the supporting part 112.

The claw parts 117 are formed in two positions on each holding member 64b, apart from each other in a predetermined distance in the horizontal direction. If each holding member 64b is provided with a single claw part 117, there arises a problem of impossibility to hold the wafer W certainly when the claw part 117 has to hold a notch 131 of the wafer W. According to the embodiment, however, since two claw parts 117 are apart from each other in a predetermined distance, it is possible to certainly hold the wafer W irrespective of the position of the notch 131 of the wafer W.

Similarly to the column part 110 of the supporting member 64a, the column part 115 of each holding member 64b has tapered side faces to reduce its air resistance during the rotation of the rotary plate 61 (see FIGS. 4 and 5). Alternatively, the side faces of the column part 115 may be curved as similar to those of the column part 110 of the supporting member 64a. Since this formation of the side faces allows air resistance exerted to the column part 115 during the rotation of the plate 61, it is possible to restrain an occurrence of deviation on the column part 115 thereby holding the wafer W certainly. In addition, it is possible to lighten a burden on the motor 66 thereby restraining an occurrence of loud noise due to air resistance.

A connecting member 119 having a pivot member 119a is fixed to the backside of the rotary plate 61 by screws 118b. The holding members 64b are attached to the rotary plate 61 while each allowing the pivot member 119 to pass through the through-hole 116a. On the other hand, near the end of the base part 116, a spring 120 is disposed between the base part 116 and the rotary plate 61. Below the spring 120, a pressing mechanism 121 (e.g. cylinder: not shown in FIGS. 4 and 5) is arranged to urge the lower face of the base part 116 upward.

When the pressing mechanism 121 is moved upward to urge the end of the base part 116 against the rotary plate 61, the spring 120 shrinks to rotate the whole holding member 64b about the pivot member 119a at a designated angle. Then, the claw parts 117 move to the outside of the rotary plate 61. On the other hand, when the pressing mechanism 121 is moved downward, the spring 120 expands to rotate the whole holding member 64b about the pivot member 119a at a designated angle, whereby the claw parts 117 move to the inside of the rotary plate 61. In this way, both the spring 120 and the pressing mechanism 121 have a function to adjust the position of the claw parts 117.

Noted that it is desirable to make the column part 115 similar in weight to base part 116 in the holding member 64b. In other words, it is desirable to construct the holding member 64b so that its center of gravity is level with the lower face of the rotary plate 61 having the holding member 64b attached thereto. Consequently, when rotating the rotary plate 61, it is possible to make a centrifugal force acting on the column part 115 similar to another centrifugal force acing on the base part 116, thereby establishing a constant force to hold the wafer W.

However, when it is required to increase this holding force for the wafer W at the rotation of the rotary plate 61, it is possible to increase the weight of the base part 116. While, when it is required to decrease this holding force for the wafer W at the rotation of the rotary plate 61, it is possible to increase the weight of the column part 115. In order to attain such an adjustment of a balance in weight between the column part 115 and the base part 116, when the holding member 64b is made of e.g. resin, it is preferable to embed a material having a different specific gravity, such as metal (the metal block 122 of FIG. 9), in the column part 115 or the base part 116.

The under plate 63 is connected with a shaft 67 penetrating a center portion of the rotary plate 63 and also an interior of the rotating cylinder 62. The shaft 67 is fixed on an upper face of a horizontal plate 68. In integral with the shaft 67, this horizontal plate 68 is movable in the vertical direction by an elevating mechanism 69 having an air cylinder etc. In the under plate 63 and the shaft 67, a lower cleaning-liquid supply path 75 is formed to supply the wafer W with a cleaning liquid (e.g. chemical liquid, deionized water) and a dry gas.

When the wafer W is transferred between the spin chuck 59 and the main transporting arm 34, the under plate 63 is lowered to a position close to the rotary plate 61 in order to avoid an interference of the plate 63 with the main transporting arm 34. When cleaning the back side of the wafer W, the under plate 63 is elevated to a position close to the back side of the wafer W held by the holding members 64b, so that the wafer W is supplied with a cleaning liquid etc. discharged from the lower cleaning-liquid supply path 75. Note, by moving the rotating cylinder 62 up and down while fixing the under plate 63 at a designated level, a clearance between the wafer W and the under plate 63 may be adjusted in accordance with the progress of the cleaning operation.

The top plate 60 is connected with a pivot shaft 70 through its lower end and is rotatable by a motor 72 mounted on a horizontal plate 71. The pivot shaft 70 is rotatably supported on the lower face of the horizontal plate 71. This horizontal plate 71 can move up and down in the vertical direction owing to an elevating mechanism 73, such as air cylinder, fixed on the upper wall of the outer chamber 43. In the top plate 60 and the pivot shaft 70, an upper cleaning-liquid supply path 85 is formed to supply the wafer W with a cleaning liquid (e.g. chemical liquid, deionized water) and a dry gas.

When the wafer W is transferred between the spin chuck 59 and the main transporting arm 34, the top plate 60 is maintained to a position close to the upper wall of the outer chamber 43 in order to avoid an interference of the top plate 60 with the main transporting arm 34. When cleaning the front side (upper face) of the wafer W, the top plate 60 is lowered to a position close to the front side of the wafer W held by the holding members 64b, so that the wafer W is supplied with a cleaning liquid etc. discharged from the upper cleaning-liquid supply path 85.

The chemical arm housing 44 is provided with a window 48' and a third shutter 48 for closing the window 48' by means of a not-shown driving mechanism. When segregating the chemical arm housing 44 from the outer chamber 43 atmospherically, the third shutter 48 is closed. The rinsing/drying arm housing 45 is provided with a window 49' and a fourth shutter 49 for closing the window 49' by means of a not-shown driving mechanism. When segregating the rinsing/drying arm housing 45 from the outer chamber 43 atmospherically, the fourth shutter 49 is closed.

A chemical supply arm 50 is accommodated in the chemical arm housing 44. The chemical supply arm 50 includes a chemical nozzle 51 and a rinse nozzle 52. In operation, the chemical nozzle 51 is capable of ejecting a chemical liquid and $N_2$-gas, while the rinse nozzle 52 can eject both IPA and deionized water. With the rotation of the chemical supply arm 50, the chemical nozzle 51 and the rinse nozzle 52 enter into the outer chamber 43, so that the wafer W held by the spin chuck 59 can be scanned, at least wafer's portion between its center and the periphery, by the nozzles 51, 52.

Except the cleaning operation of the wafer W, the chemical supply arm 50 is retained in the chemical arm housing 44. Since the chemical arm housing 44 is usually present in a chemical atmosphere, the chemical supply arm 50 is formed by corrosion resistant parts. Noted that the chemical supply arm 50 may further include a nozzle capable of ejecting an additional chemical liquid. Further, preferably, the third shutter 48 is controlled so as to open and close the window 48' in accordance with a timing of the rotating action of the chemical supply arm 50.

A rinsing/drying arm 53 is accommodated in the rinsing/drying arm housing 45. The rinsing/drying arm 53 includes a $N_2$ supply nozzle 54 and a rinse nozzle 55. In operation, the $N_2$ supply nozzle 54 is capable of ejecting $N_2$-gas, while the rinse nozzle 55 can eject both IPA and deionized water. With the rotation of the rinsing/drying arm 53, the $N_2$ supply nozzle 54 and the rinse nozzle 55 enter into the outer chamber 43, so that the wafer W held by the spin chuck 59 can be scanned, at least wafer's portion between its center and the periphery, by the nozzles 54, 55.

Except the cleaning operation of the wafer W, the rinsing/drying arm 53 is retained in the rinsing/drying arm housing 45. Although the rinsing/drying arm housing 45 is not present in a chemical atmosphere, it is desirable to form the rinsing/drying arm 53 by corrosion resistant parts. Noted that the rinsing/drying arm 53 may further include a nozzle capable of ejecting an additional chemical liquid. Further, preferably, the fourth shutter 49 is controlled so as to open and close the window 49' in accordance with a timing of the rotating action of the rinsing/drying arm 53.

The chemical arm housing 44 is equipped with a chemical-arm cleaning unit 56 that can clean the chemical nozzle 51 at appropriate intervals. When the unit 56 cleans the chemical nozzle 51, the third shutter 48 is closed in order to prevent an atmosphere in the chemical arm housing 44 from leaking out to the housing 42 and the outer chamber 43. The rinsing/drying arm housing 45 is equipped with a rinsing/drying arm cleaning unit 57 that can clean the rinse nozzle 55 at appropriate intervals. When the unit 57 cleans the rinse nozzle 55, the fourth shutter 49 is closed in order to prevent an atmosphere in the rinsing/drying arm housing 45 from leaking out to the housing 42 and the outer chamber 43.

Figure 11:
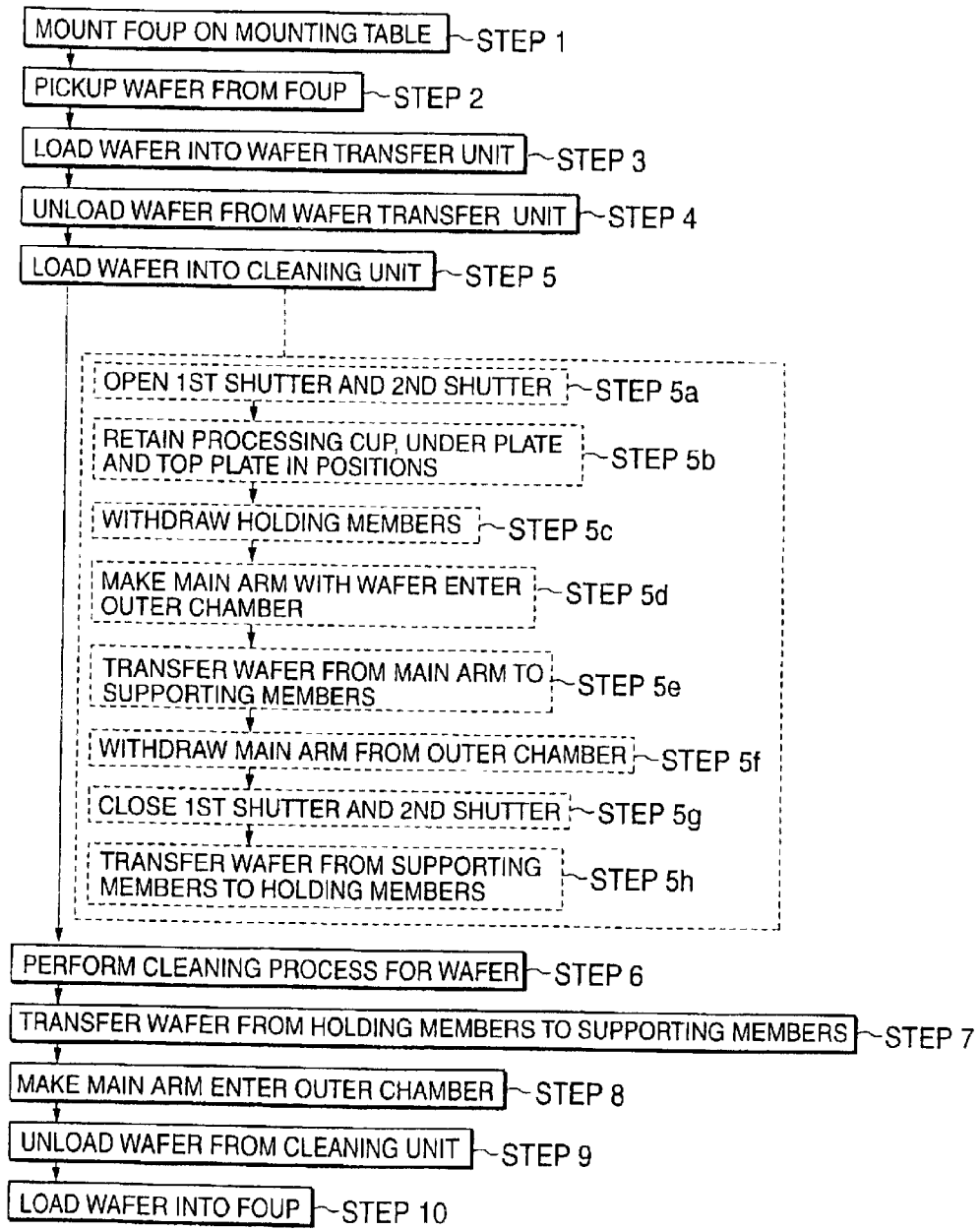
FIG. 11 is an explanatory flow chart showing the outline of a cleaning process.

Next, the cleaning process by the cleaning system 1 will be described. FIG. 11 is a flow chart giving an outline of the cleaning process. First, by a transfer robot and an operator (both not shown), the FOUP F having unprocessed wafers W (before cleaning) accommodated therein is arranged on the mounting table 6 of the in/out port 4, at a designated position (step 1). Then, the wafers W are taken out of the FOUP F mounted on the mounting table 6 one by one, by the sub-transporting arm 11 (step 2). The so picked-up wafer W is delivered to either one of the wafer transfer units (TRS) 16, 17 (step 3). The main wafer transporting unit 18 picks up the wafer W from the wafer transfer unit (TRS) 16 (or 17) through any one of the main transporting arms 34 to 36, for example, the arm 34 (step 4) and continuously loads the wafer W into any one of the cleaning units (CLN) 12 to 15, for example, the cleaning unit (CLN) 12 (step 5).

The operation at step 5 is divided into steps 5a to 5h schematically, as follows. In FIG. 11, respective processes at steps 5a to 5h are shown in another frame. First, it is executed to open the first shutter 46 of the housing 42 and the second shutter 47 of the outer chamber 43 (step 5a). Substantially simultaneously with or before this step 5a, it is executed to hold the processing cup 58 at the withdrawal position, the under plate 63 at the lowered position and the top plate 60 at the position close to the upper wall of the outer chamber 43a (step 5b). Notes that the third shutter 48 and the fourth shutter 49 are maintained in their closed conditions.

FIG. 12 is an explanatory view showing a state that the wafer W is supported by the supporting members 64a (only one shown). While, FIG. 13 is an explanatory view showing a state that the wafer W is held by the holding members 64b (only one shown). The delivery of the wafer W between the main transporting arm 34 and the spin chuck 59 is carried out between the arm 34 and the supporting members 64a. Thus, in delivering the wafer W between the main transporting arm 34 and the spin chuck 59, each of the holding member 64b is maintained in a condition that the pressing mechanism 121 is pressing the base part 116 to retract the spring 120 and withdraw the claw parts 117 outward, in order to prevent the holding member 64b from disturbing the delivery of the wafer W (step 5c).

In this state, it is executed to make the main transporting arm 34 holding the wafer W enter into the outer chamber 43 (step 5d). Then, the wafer W is transferred from the main transporting arm 34 to the supporting members 64a so that the wafer W is supported on the supporting parts 112 of the members 64a (step 5e). FIG. 12 illustrates such a situation as mentioned above. Noted that the supporting members 64a support the wafer W only when the rotary plate 61 stands still. Once the wafer W is supported by the supporting members 64a, the main transporting arm 34 is withdrawn from the outer chamber 43 (step 5f) and the first shutter 46 and the second shutter 47 are closed together (step 5g). Next, each pressing mechanism 121 is moved downward from the base part 116 to expand the spring 120. Consequently, the whole holding member 64b rotates about the pivot member 119a by a predetermined angle, whereby the claw parts 117 are moved from the outside to the inside. Then, each claw part 117 firstly receives the edge of the wafer W supported by the supporting members 64b, through the lower wall part 117b. Subsequently, the wafer W moves into the groove defined by the wall parts 117a, 117b of the claw part 117 while following the inclined wall part 117a. At this time, since the groove of each claw part 117 is positioned higher than the supporting parts 112, the wafer W is separated from the supporting members 64b. The wafer W is lifted from the supporting parts 112 by a predetermined distance (step 5h). That is, the wafer W is shifted from a condition of FIG. 12 to another condition of FIG. 13. With a further movement of the wafer W, its edge is finally pinched between the upper wall part 117a and the lower wall part 117b. In this way, the wafer W is retained in the grooves of the claw parts 117 finally.

In this way, the holding members 64b are adapted so as to hold the wafer W while it is being separated from the supporting members 64a. The supply of the cleaning liquid and the dry gas to the wafer W and the rotation of the spin chuck 59 are performed on condition that the wafer W is held by the holding members 64b. Consequently, it is possible to prevent an occurrence of unprocessed portions on the wafer W, which might be produced due to the contact of the back side of the wafer W with the supporting members 64a. Additionally, since each claw part 117 holds the wafer W through its edges, it is possible to reduce an area of non-cleaned portions about the wafer W, which are unavoidable in holding the wafer W, as possible. In this way, it is possible to produce the wafers W of high quality.

Conversely, when the pressing mechanisms 121 press the base parts 116 of the holding members 64b to shorten the springs 120 under condition that the holding members 64 are holding the wafer W, it is delivered from the holding members 64b to the supporting members 64a on the way of the claw parts 117 to the outside of the rotary plate 61. That is, the situation about the wafer W is shifted from the condition of FIG. 13 to the condition of FIG. 12. In order to ensure the delivery of the wafer W from the holding members 64b to the supporting members 64a, it is desirable that the holding members 64b hold the wafer W so that a level of the back face of the so-held wafer W is lower than the top of the wall part 113 of each supporting member 64a.

Each pressing mechanism 121 serves as a driving mechanism to move the corresponding holding member 64b in a manner that the wafer W, which has been supported by the supporting members 64a, is released therefrom and subsequently held by the holding members 64b and conversely, the wafer W, which has been held by the holding members 64b, is released therefrom and subsequently supported by the supporting members 64a. Each spring 120 serves as a holding mechanism to maintain the corresponding holding member 64b at a designated position so that the wafer W can be held by the holding members 64b while the wafer W is being separated from the supporting members 64a.

After the wafer W is held by the holding members 64b, it is executed to perform a designated cleaning process (step 6). Then, the processing cup 58 is elevated and held at the processing position to discharge the used chemical liquid, deionized water, etc. from the drain 58a.

The cleaning of the wafer W may be completed by a variety of methods. For example, when cleaning the front (upper surface) side of the wafer W, there may be successively carried out a chemical process using the chemical nozzle 51 or the upper cleaning-liquid supply path 85, a rinsing process using the rinse nozzle 52 (or 55) or the upper cleaning-liquid supply path 85 and a drying process using the $N_2$ supply nozzle 54 or the upper cleaning-liquid supply path 85, in order.

Here, as the above chemical processing method, there are the following methods of: (1) forming a chemical paddle on the wafer W at a standstill or rotating slowly and maintaining such a situation for a predetermined period; (2) ejecting a predetermined quantity of chemical liquid to the wafer W rotating at a designated speed of rotation and further rotating the chemical supply arm 50 so that the chemical nozzle 51 scans the wafer W between its center and the periphery; (3) moving the top plate 60 close to the upper face of the wafer W, forming a chemical layer between the top plate 60 and the wafer W at a standstill or rotating slowly and maintaining such a situation for a predetermined period and so on.

In the above chemical processing method (1), the process to form the chemical paddle on the wafer W may be carried out by first using the chemical nozzle 51. If a quantity of the above paddle is reduced since the chemical liquid falls from the wafer W within the predetermined period, then a predetermined quantity of chemical liquid may be refilled onto the wafer W through the upper cleaning-liquid supply path 85. After forming the paddle on the wafer W, it is also preferable to make the top plate 60 adjacent to the paddle thereby preventing the chemical liquid from evaporating from the paddle.

As for the rinsing method, it is employed to rotate the wafer W at a predetermined speed on rotation thereby throwing off a chemical liquid therefrom and simultaneously eject the rinsing liquid against the wafer W through the rinse nozzle 52 (or 55) or the upper cleaning-liquid supply path 85. As for the drying method, it is employed to rotate the wafer W at a high speed while supplying the wafer W with $N_2$-gas through the $N_2$ nozzle 54 or the upper cleaning-liquid supply path 85.

In case of cleaning both sides (upper and lower faces) of the wafer W simultaneously, the back side of the wafer W is cleaned by using the under plate 63 and the lower cleaning-liquid supply path 75 at the same time of the above-mentioned cleaning of the upper face of the wafer W. This cleaning of the bask side of the wafer W is carried out by first making the under plate 63 adjacent to the back side of the wafer W; second supplying a clearance between the wafer W and the under plate 63 with a chemical liquid through the lower cleaning-liquid supply path 75 thereby forming a chemical layer therebetween; third maintaining such a situation for a predetermined period; fourth supplying the clearance between the wafer W and the under plate 63 with deionized water etc. through the lower cleaning-liquid supply path 75 thereby washing out the chemical liquid in rinsing; and finally rotating the wafer W at a high speed while supplying the clearance between the wafer W and the under plate 63 with $N_2$-gas through the lower cleaning-liquid supply path 75.

On completion of the cleaning process of the wafer W, the processing cup 58 and the under plate 63 are lowered, while the top plate 60 is elevated. In this state, the wafer W is shifted from the holding members 64b to the supporting members 64a (step 7). Next, the first shutter 46 and the second shutter 47 are together opened to allow the main transporting arm 34 to enter into the outer chamber 43 (step 8). Then, in accordance with the opposite processing order to the above-mentioned processing order to transfer the wafer W from the main transporting arm 34 to the spin chuck 59, the wafer W is transferred from the spin chuck 59 to the main transporting arm 34 and subsequently, the wafer W is discharged from the cleaning unit (CLN) 12 (step 9).

By the main transporting unit 18, the wafer W is transported to either one of the wafer transfer units 16, 17 and mounted thereon. Continuously, the sub-transporting arm 11 picks up the wafer W from the wafer transfer unit (TRS) 16 (or 17) and places the wafer W into an empty slot of the FOUP F that included the same wafer W in the past (step 10).

The present invention is not limited to the above-mentioned embodiment only. For example, although the supporting members 64a and the holding members 64b are each provided about the rotary plate 61 at three positions in the above-mentioned embodiment, the same members may be each provided about the rotary plate at four or more positions on consideration of both strength and rigidity of the rotary plate 61. On the contrary, if enlarging the sizes of the supporting members 64a and the holding members 64b, the wafer W could be supported or held by two members each. The present invention is not limited to a cleaning apparatus for cleaning the substrates and therefore, the invention is applicable to various apparatuses that perform a liquid processing with various processing liquids. Noted that the substrates are not only semiconductor wafers but also other substrates, for example, glass substrates for LCD, ceramic substrates, etc.

As mentioned above, according to the liquid processing apparatus and method of the present invention, since the liquid processing is carried out while not supporting the substrate but holding its end face, it is possible to prevent an occurrence of unprocessed portions on the substrate due to the in sufficient prevalence of the processing liquid. Therefore, a uniform liquid processing for the substrate can be accomplished to improve the quality of the substrate. Again noted that the side faces of each holding member are tapered so as to reduce an air resistance of the rotary plate during the rotation. Therefore, even when the rotary plate is rotated, it is possible to restrain an occurrence of rotational deviation in the holding member, whereby the substrate can be held stably. Additionally, since the holding members and the supporting members are fixed on the interior side the rotary plate, it is possible to restrain an occurrence of bending in the rotary plate during the rotation, whereby the holding members can hold the substrate certainly. Further, since each holding member is formed to hold the substrate by the claw parts at a predetermined interval, it is possible to hold the substrate certainly although it is provided with a notch.

Next, the second embodiment of the present invention will be described with reference to FIGS. 14 to 21B.

Figure 14:
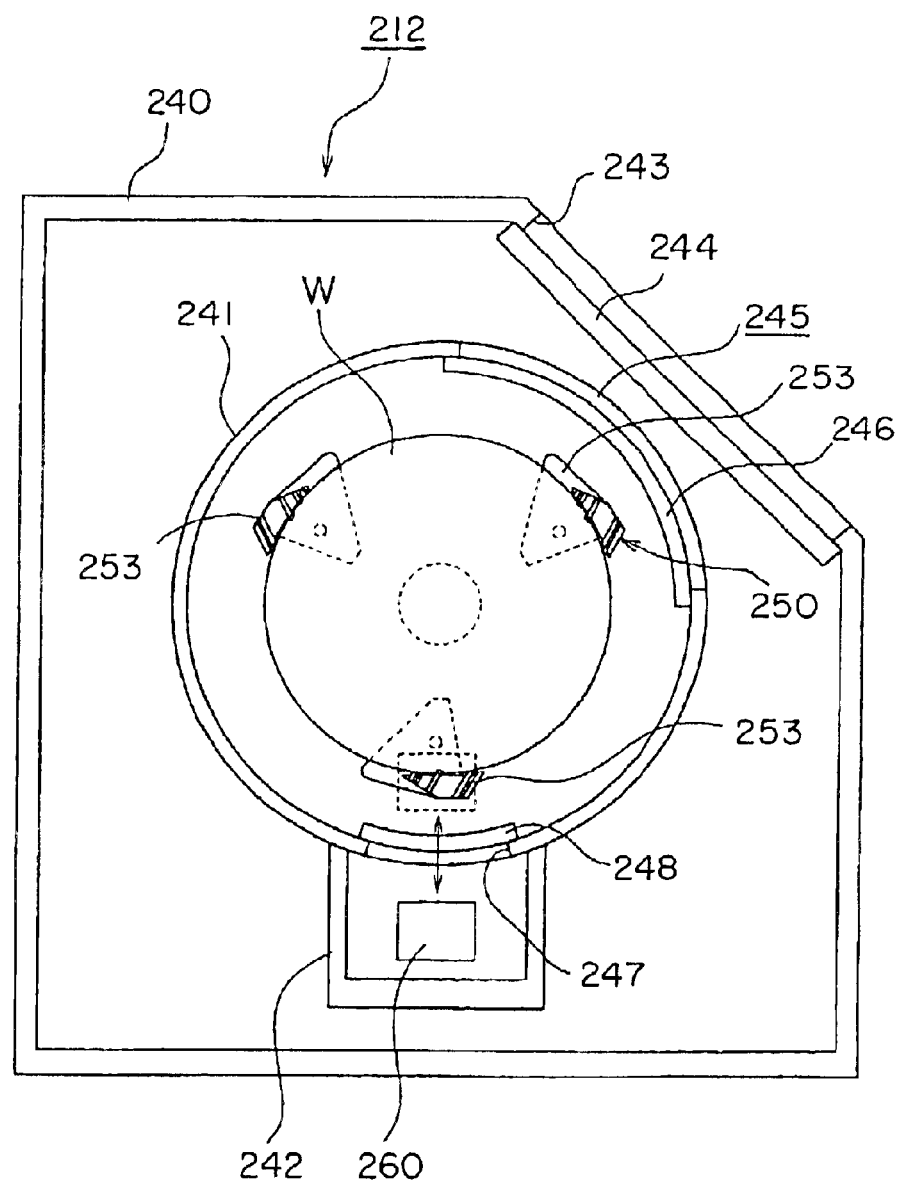
FIG. 14 is a schematic plan view of a substrate cleaning unit and a spin chuck in accordance with a second embodiment of the present invention.

FIG. 14 is a plan view of a substrate cleaning unit 212. In a unit chamber 240 of the substrate cleaning unit 212, it includes an outer chamber 241 having a closed structure to accommodate the wafer W therein and an edge arm housing 242. The unit chamber 240 is provided, on one side thereof, with an opening 243 and a unit-chamber mechanical shutter 244 for closing the opening 243 by means of a not-shown closing mechanism. When a transporting arm 219 loads the wafer W into the substrate cleaning unit 212 through the opening 243 or unloads the wafer W from the unit 212 through the opening 243, the unit-chamber mechanical shutter 244 opens. The shutter 244 is adapted so as to close or open the opening 243 on the inside of the unit chamber 240. With this arrangement of the shutter, even if the interior of the unit chamber 240 has a positive pressure, it is possible to prevent an atmosphere inside the unit chamber 240 from leaking out.

Similarly, the outer chamber 241 is provided with an opening 245 and an outer-chamber mechanical shutter 246 for closing the opening 245 by means of a not-shown cylinder driving mechanism. When the transporting arm 219 loads the wafer W into the outer chamber 241 through the opening 245 or unloads the wafer W from the outer chamber 241 through the opening 245, the outer-chamber mechanical shutter 246 opens. The outer-chamber mechanical shutter 246 may be closed by the closing mechanism in common with the unit-chamber mechanical shutter 244. The outer-chamber mechanical shutter 246 is adapted so as to close or open the opening 245 on the inside of the outer chamber 241. With this arrangement of the shutter, even if the interior of the outer chamber 241 has a positive pressure, it is possible to prevent an atmosphere inside the outer chamber 241 from leaking out.

The edge arm housing 242 is provided with an opening 247 and an edge-arm housing shutter 248 for closing the opening 247 by means of a not-shown driving mechanism. When separating the edge arm housing 242 from the outer chamber 241 atmospherically, the edge-arm housing shutter 248 is closed. The edge-arm housing shutter 248 is adapted so as to close or open the opening 247 on the inside of the outer chamber 241. With this arrangement of the shutter, even if the interior of the unit chamber 240 has a positive pressure, it is possible to prevent an atmosphere inside the unit chamber 240 from leaking out.

An edge arm 260 capable of ejecting a chemical liquid, deionized water and inert gas, for example, nitrogen ($N_2$) gas is stored in the edge arm housing 242. The edge arm 260 is accommodated in the outer chamber 241 and is movable to the circumference (periphery) of the wafer W held by a spin chuck 250 described later. The edge arm 260 is adapted so as to stand ready in the edge arm housing 242 except to process the wafer W. When the edge arm 260 moves into the outer chamber 241 through the opening 247, the edge-arm housing shutter 248 opens.

As shown in FIG. 15, the outer chamber 241 includes an inner cup 270 for accommodating the wafer W therein, the above spin chuck 250 arranged in the inner cup 270 to rotatably hold the wafer W while directing, for example, the front face of the wafer W upward, and a top plate 271 which is capable of access to the front face of the wafer W held by the spin chuck 250. The outer chamber 241 is equipped, on its top, with a gas nozzle 290, which ejects temperature-controlled inert gas in the circumference of the wafer W.

The spin chuck 250 includes a chuck body 251 for holding the wafer W horizontally and a rotating cylinder 252 connected with the bottom of the chuck body 251. In the chuck body 251, there is arranged an under plate 272 which is relatively movable between a position close to the back face of the wafer W held by the spin chuck 250 and another position far from the back face of the wafer W.

The chuck body 251 is provided, on its top, with a plurality of holding members for locating the wafer W in position, namely, centering of the wafer W. For example, three holding members 253 are formed to hold the periphery of the wafer W at regular intervals, for example, an angle of 120 degree in the circumferential direction of the wafer W. A timing belt 281 is wound about the outer circumferential face of the rotating cylinder 252 and also a drive shaft 280a of a drive motor 280. When the timing belt 281 is driven by the motor 280, the whole spin chuck 250 rotates. Noted that the drive motor 280 is formed by e.g. a servo motor and is rotatable at low and high speeds by control signals from not-shown control means, such as CPU.

Figure 16:
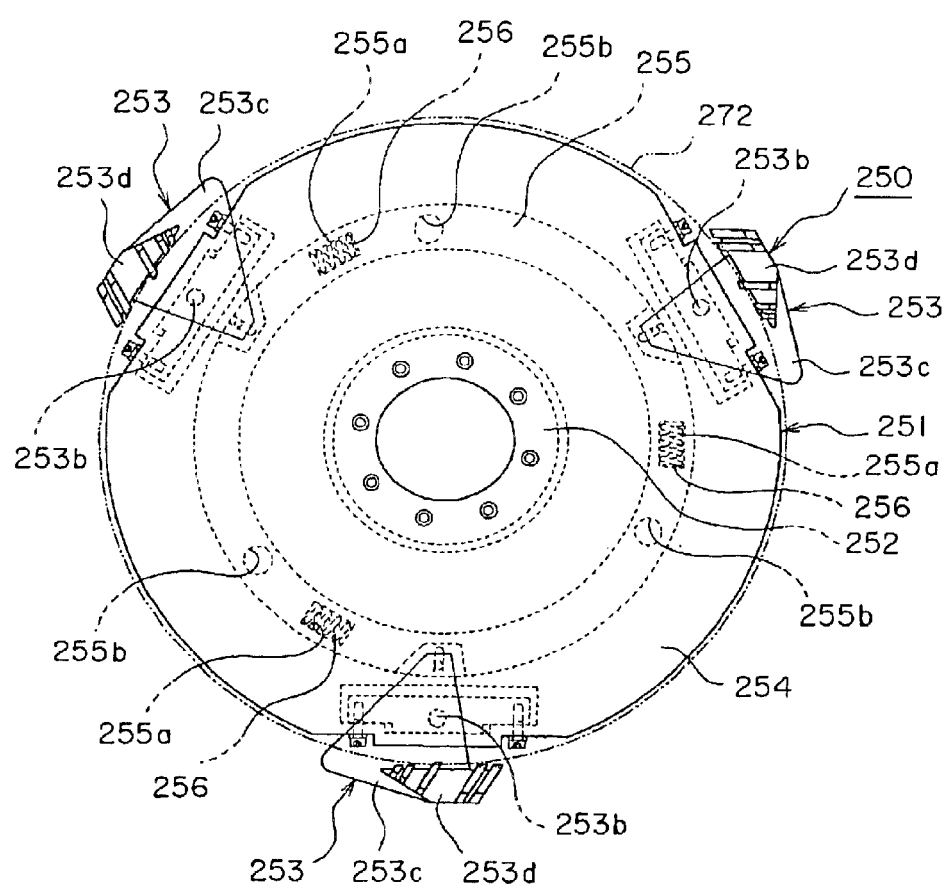
FIG. 16 is a plan view of the spin chuck.
Figure 17A:
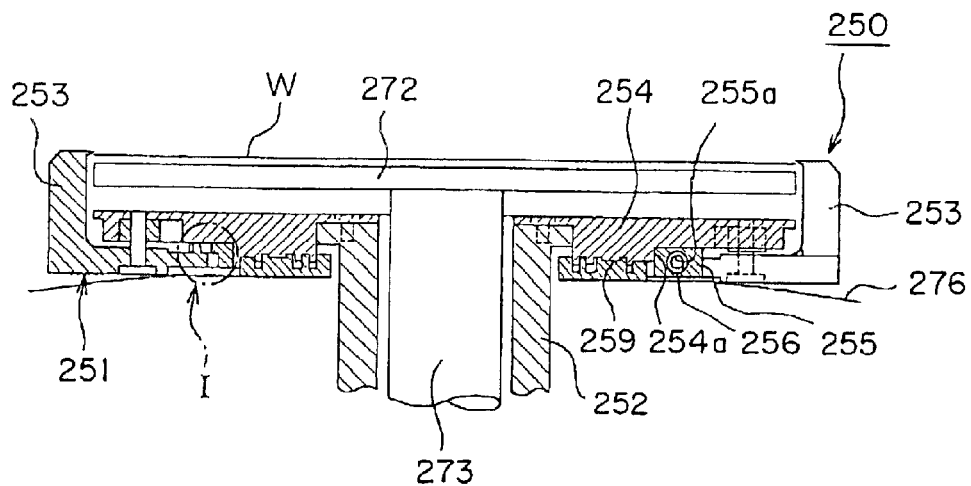
FIG. 17A is a sectional view of the spin chuck.
Figure 17B:
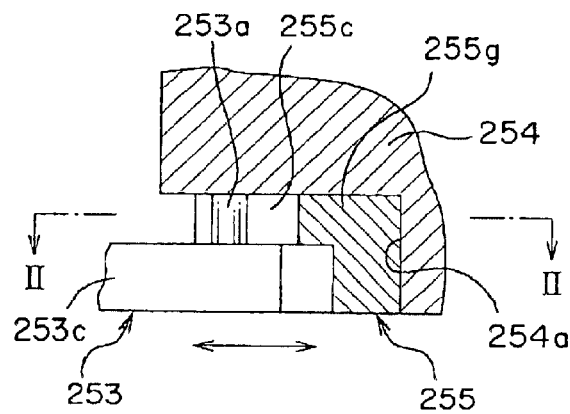
FIG. 17B is an enlarged view of a part I of FIG. 17A.
Figure 17C:
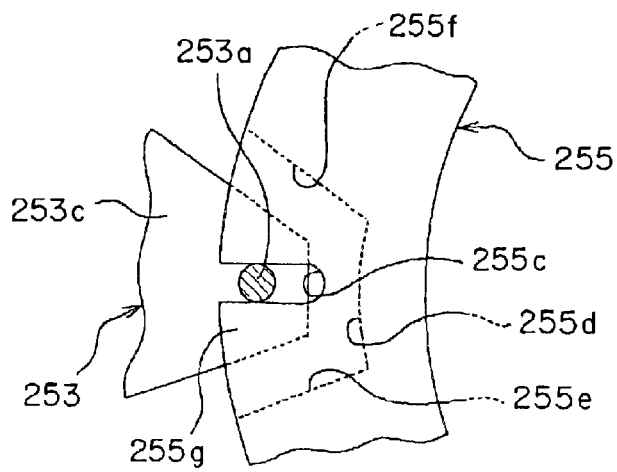
FIG. 17C is a sectional view taken along a line II—II of FIG. 17B.

The above chuck body 251 includes a base part 254 in the form of a circular disc and a ring body 255 rotatably (slidably) engaged with a concentric step part 254a formed on the lower face of the base part 254, as shown in FIGS. 16 and 17C. Noted that a seal member 259, such as labyrinthine seal, is interposed between the lower face of the chuck body 251 and the upper face of a fixing base 276.

The ring body 255 is provided, at several positions thereof (e.g. three positions at regular intervals), with spring recesses 255a. In each spring recess 255a, there is accommodated a compressed coil spring 256 which has one end engaging with the base part 254 and the other end engaging with the ring body 255. Thus, owing to the urge of elastic forces of the coil springs 256 in the recesses 255a, the ring body 255 is capable of rotating in one direction usually (i.e. counter-clockwise direction of FIG. 16).

Figure 18A:
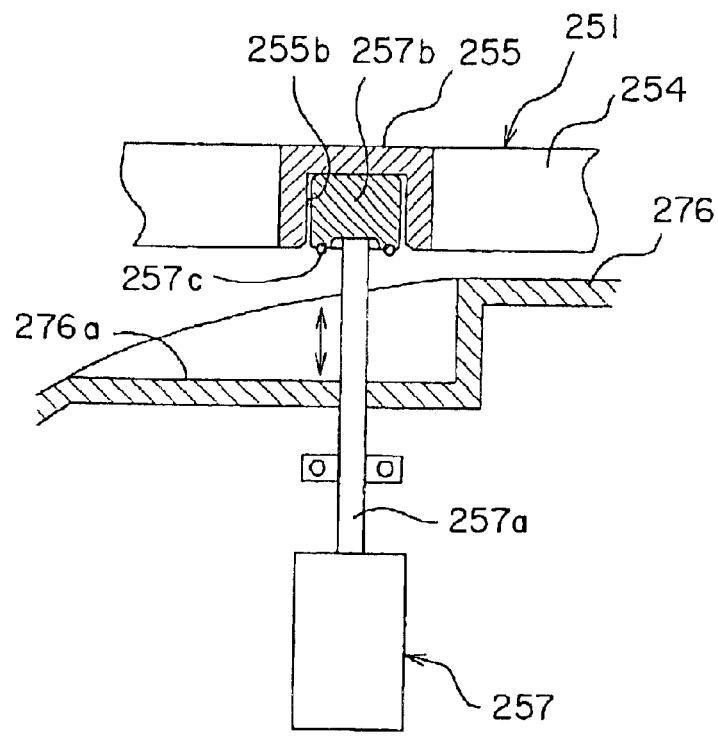
FIG. 18A is a sectional view showing a locking state of a locking mechanism in the spin chuck.
Figure 18B:
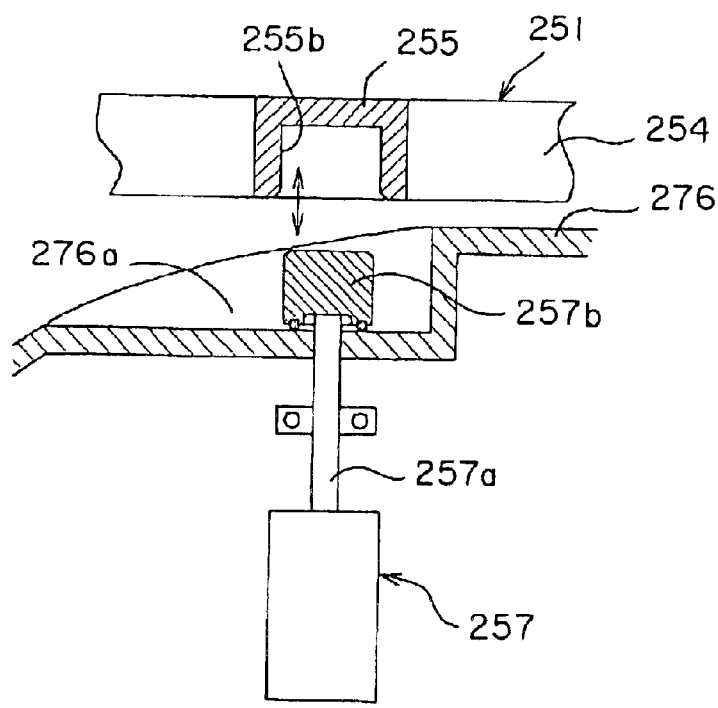
FIG. 18B is a sectional view of an unlocking state of the locking mechanism in the spin chuck.

As shown in FIGS. 18A and 18B, circular engagement holes 255a are formed at several positions (e.g. three positions at regular intervals) on the lower face of the ring body 255. A lock mechanism 257 is engageable with each engagement hole 255a. The lock mechanism 257 is formed by an air cylinder mounted on a fixing base 276 below the chuck body 251. The lock mechanism 257 includes an expandable piston rod 257a and a column-shaped lock piece 257b attached to a tip of the piston rod 257a to move up and down. In operation, this lock piece 257b is disengageably fitted into the engagement hole 255a by the lock mechanism 257. That is, when the spin chuck 250 is inactivated, the lock piece 257b is fitted into the engagement hole 255b to prevent the chuck body 251 from rotating. When the spin chuck 250 is activated, the lock piece 257b of the lock mechanism 257 moves down to cancel the engagement (fit) with the engagement hole 255b, so that the spin chuck 259 can rotate. Noted that, the lock piece 257a is provided, on its lower face, with an O-ring 257c which comes in close contact with a top of a recess 276a formed in the fixing base 276 (see FIGS. 18A and 18B). Guide recess 255d are formed at several position (e.g. three position at regular intervals) on the outer periphery of the ring body 255. Each guide recess 255d has a guide groove 255c for guiding each of the holding members 253. As shown in FIG. 17C, the guide recess 255d is in the form of a notch that opens outward of the ring body 255. In detail, the notch is formed on a lower face of the outer periphery of the ring body 255. Again, the guide recess 255d is defined by side walls 255e, 255f. The side wall 255f is inclined to the side wall 255e, so that the guide recess 255d gradually spreads outward in the radial direction. Above the guide recess 255d, the upper face of the ring body 255 extends to form an extension 255g. This extension 255g is provided with a guide groove 255c opening outward. Slidably fitted into the guide groove 255c is a guide pin 253a that stands from the holding member 253.

Figure 19A:
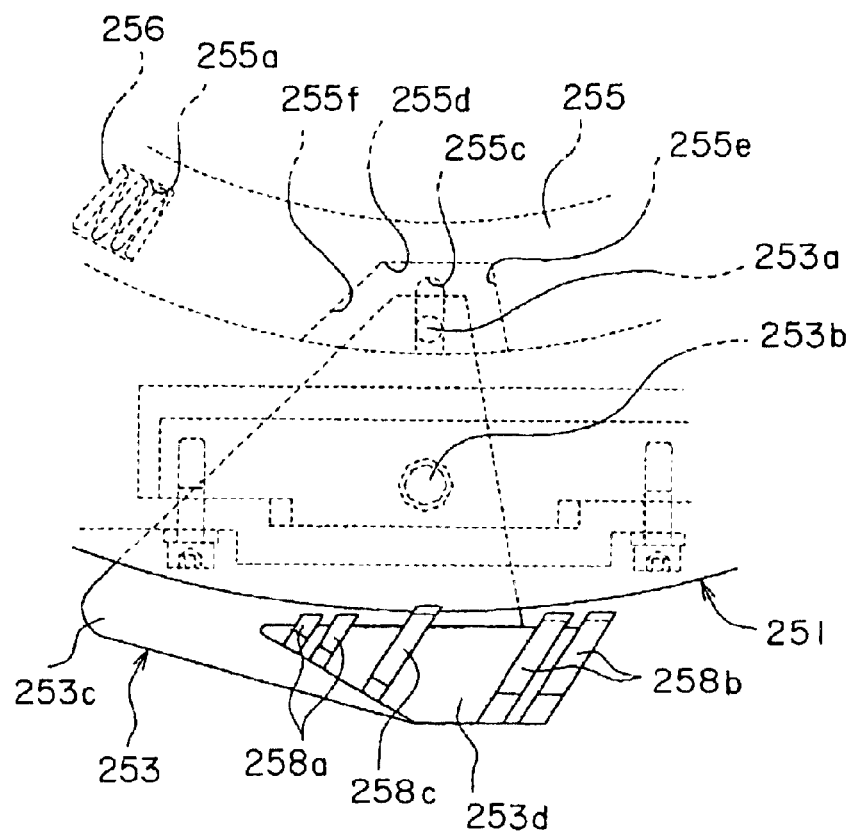
FIG. 19A is a plan view of an essential part showing a wafer holding state at the time of standstill of the rotation of the spin chuck.
Figure 19B:
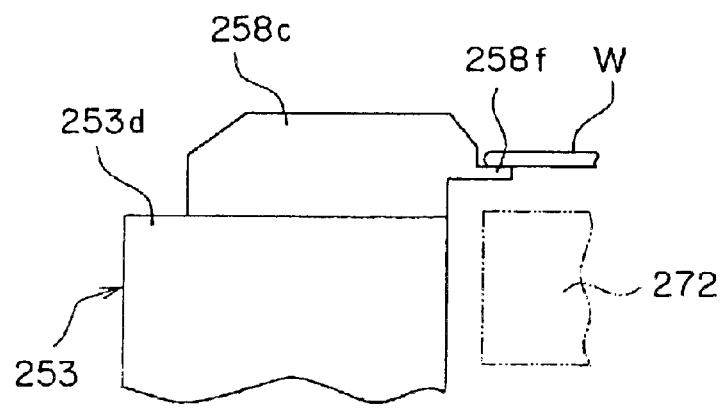
FIG. 19B is a side view of the essential part showing the wafer holding state of FIG. 19A.
Figure 20A:
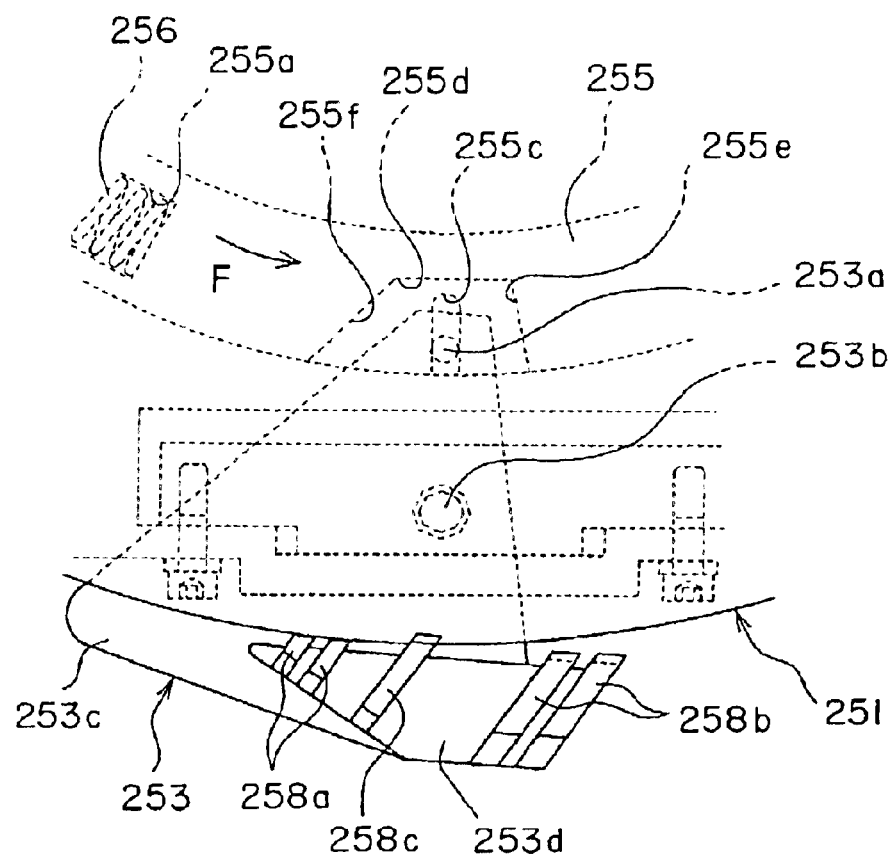
FIG. 20A is a plan view of an essential part showing a wafer holding state when the spin chuck rotates at a low speed.
Figure 20B:
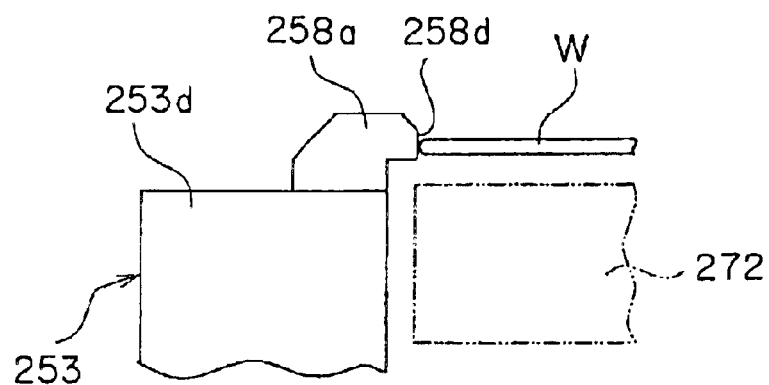
FIG. 20B is a side view of the essential part showing the wafer holding state of FIG. 20A.
Figure 21A:
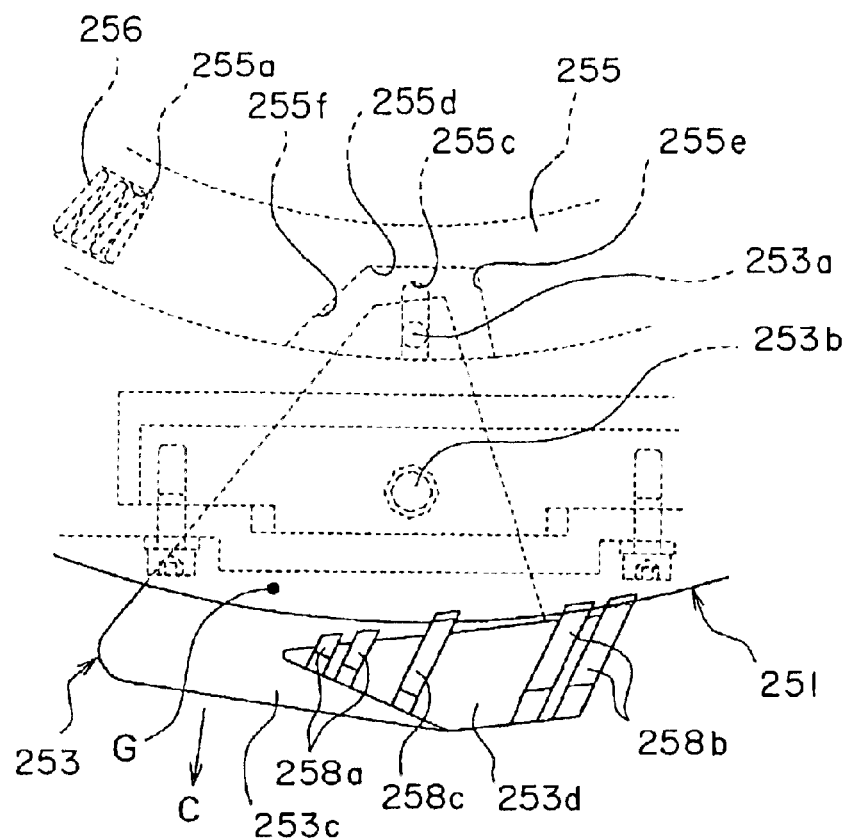
FIG. 21A is a plan view of an essential part showing a wafer holding state when the spin chuck rotates at a high speed.
Figure 21B:
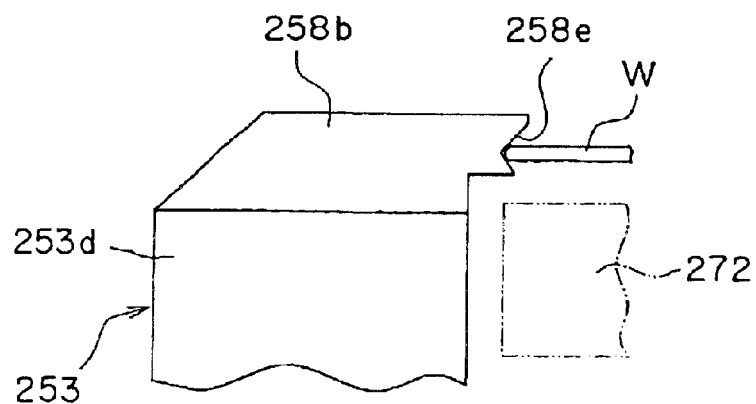
FIG. 21B is a side view of the essential part showing the wafer holding state of FIG. 21A.

The holding members 253 are pivotally fitted on the lower face of the base part 254 of the chuck body 251 through respective pivot pins 253b. Each holding member 253 includes a plate body 253c shaped to be substantially triangular in plan view and projecting from the base part 254 outward, and a holding body 253d standing on the leading side of the plate body 253c. As shown in FIG. 21A, the pivot pin 253b of each holding member 253 is deviated from a gravity center G of the plate body 253c, while the above guide pin 253a is arranged on the base side of the plate body 253c. The holding body 253d includes a first holding part 258a that holds the periphery of the wafer W when the spin chuck 250 rotates at a low speed (e.g. 10–300 r.p.m.) and a second holding part 258b that holds the periphery of the wafer W when the spin chuck 250 rotates at a high speed (e.g. 500–2000 r.p.m.). The first holding part 258a is positioned at the rear end of the holding member 253, opposite to the rotating direction of the spin chuck 250. While, the second holding part 258b is positioned at the front end of the holding member 253 in the rotating direction of the spin chuck 250. Between the first holding part 258a and the second holding part 258b, the holding body 253d further includes a third holding part 258c that holds the periphery of the wafer W when the spin chuck 250 stops rotating. When the spin chuck 250 rotates at a speed from 300 r.p.m. to 500 r.p.m., the holding of the wafer w is switched from the third holding part 258c to the second holding part 258b. In this embodiment, the first holding part 258a is formed by two parallel pieces, as shown in FIGS. 20A and 20B. The first holding part 258a is provided, on its inside, with a vertical face 258d for contact with the peripheral end face of the wafer W. The reason why the first holding part 258a is provided with the vertical face 258d is that it becomes possible to hold the wafer W certainly since the wafer W is urged in its horizontal rotating direction by an elastic force F of each coil spring 256. Similarly, the second holding part 258b is formed by two parallel pieces, as shown in FIGS. 21A and 21B. The second holding part 258b is provided, on its inside, with a lateral V-shaped face 258e for contact with upper and lower edges of the periphery of the wafer W. The reason why the second holding part 258b is provided with the V-shaped face 258e is that it becomes possible to hold the wafer W certainly. On the other hand, the third holding part 258c is formed by a single piece, as shown in FIGS. 19A and 19B. The third holding part 258c is provided, on its inside, with a horizontal shoulder tongue 258f for supporting the lower face of the periphery of the wafer W.

When the above-constructed spin chuck 250 receives the wafer W, the lock pieces 257b of the lock mechanisms 257 are engaged into the engagement holes 255b in the ring body 255 of the chuck body 251, thereby locking the rotation of the spin chuck 250. In this state, the transporting arm 219 of a main wafer transporting unit 218 enters the upside of the chuck body 251 and subsequently falls to deliver the wafer W on to the horizontal shoulder tongues 258f of the third holding parts 258c (see FIGS. 19A and 19B). The transporting arm 219 after delivering the wafer W to the holding members 253 withdraws from the upside of the spin chuck 250. Thereafter, at the same time of the withdrawal of the transporting arm 219, the lock mechanisms 257 are operated so that the lock pieces 257b move down, thereby canceling the engagement with the engagement holes 255b. Next, the motor 280 drives to rotate the chuck body 251 at a low speed (e.g. 10 r.p.m. to 300 r.p.m.). At the start of this low-speed rotation, the ring body 255 is moved to the rotating direction of the chuck body 251 by the elastic force of the coil springs 256. Correspondingly, the guide pin 253a of each holding member 253 slides in each guide groove 255c in the ring body 255, while the holding member 253 is rotated about the pivot pin 253b to the opposite side to the rotating direction, thereby bringing the vertical face 258d of the first holding part 258a into contact with the peripheral end face of the wafer W (see FIGS. 20A and 20B). In this state, since each holding member 253 is subjected to the elastic force F of the coil spring 256, the wafer W can be held by the fist holding part 258a certainly. Additionally, since the elastic forces F of the coil springs 256 are respectively applied on the first holding parts 258a of the holding members 253 at three positions, it is possible to accomplish the positioning of the wafer W, that is, centering of the wafer W with high accuracy. After continuing the row-speed rotation for a predetermined period, the spin chuck 250 is rotated at a high speed (e.g. 500 r.p.m. to 2000 r.p.m.). Then, a centrifugal force is applied on each holding member 253, so that it pivots about the pivot pin 253b to the rotating direction of the spin chuck 250, thereby brining the V-shaped face 258e of the second holding part 258b into contact with the upper and lower peripheral edges of the wafer W (FIGS. 21A and 21B). Consequently, elements for holding the periphery of the wafer W are changed from the first holding parts 258a to the second holding parts 258b while the periphery of the wafer W is floating off the horizontal shoulder tongues 258f of the third holding parts 258c. In this way, it becomes possible to supply the chemical liquid, the deionized water, etc. to the wafer's peripheral portions and lower parts that have been brought into contact with the first holding parts 258a and the tongues 258f, respectively.

After completing the cleaning process to supply the wafer W with the chemical liquid while rotating the wafer W at a high speed by the spin chuck 250, the deionized water is supplied to the wafer W for its rinsing. Thereafter, $N_2$-gas is supplied to dry the wafer W.

In the above-mentioned embodiment, since the rotation (at a low speed) of the spin chuck 250 is started, the elastic forces F of the coil springs 256 are urged to the first holding parts 258a of the holding members 253 at three positions, accomplishing the positioning of the wafer W, that is, centering. Thus, it is possible to supply the chemical liquid to designated areas on the periphery of the wafer W, thereby cleaning it. Additionally, it is possible to supply the deionized water to designated areas on the periphery of the wafer W, thereby rinsing it.

When the cleaning process, the rinsing process and the drying process are completed in the above way, the rotation of the spin chuck 250 is stopped. After this standstill of rotation, the lock mechanisms 257 are activated to engage the lock pieces 257b into the engagement holes 255b of the ring body 255, whereby the rotation of the chuck body 251 is locked up. Subsequently, the holding members 253 each returns to an initial position of FIGS. 19A and 19B to support the periphery of the wafer W on the horizontal shoulder tongue 258f of the third holding part 258c. In this state, the transporting arm 219 of the main wafer transporting unit 218 enters the underside of the wafer W held by the holding members 253 and successively rises to accept the wafer W. In this way, the wafer W is transported out of the cleaning unit 212 by the arm 219.

The substrate cleaning unit 212 operates as follows. First, the unit-chamber mechanical shutter 244 of the unit 212 and the outer-chamber mechanical shutter 246 of the outer chamber 241 are together opened. Then, the inner cup 270 is lowered to make the chuck body 251 project upward relatively. Previously, the under plate 272 is lowered to occupy its withdrawal position in the chuck body 251. Similarly, the top plate 271 is raised to occupy its withdrawal position in advance. The edge-arm housing shutter 248 is closed.

In the above state, the transporting arm 219 carrying the wafer W enters the upside of the spin chuck 250 and continuously moves down to deliver the wafer W onto the third holding parts 258c (see FIGS. 19A and 19B). After the delivery of the wafer W, the transporting arm 219 withdraws from the outer chamber 241 and the unit chamber 240. After this withdrawal, the unit-chamber mechanical shutter 244 and the outer-chamber mechanical shutter 246 are closed together.

Next, the inner cup 270 is elevated to surround the chuck body 251 and the wafer W. The under plate 272 is elevated up to the processing position in the chuck body 251. With this movement to the processing position, a clearance (e.g. the order from 0.5 mm to 3 mm) is defined between the under plate 272 and the back face of the wafer W carried by the spin chuck 250.

Next, the back face of the wafer W and also the circumference (periphery) of the wafer W are cleaned. First, the lock mechanisms 257 operate to lower the lock pieces 257b, so that their fitting (engagement) with the engagement holes 255b is canceled. Next, the motor 280 is driven to rotate the chuck body 251 at a low speed (e.g. 10 r.p.m. to 30 r.p.m.). At the start of this low-speed rotation, the ring body 255 is moved to the rotating direction of the chuck body 251 by the elastic force of the coil springs 256. Correspondingly, the guide pin 253a of each holding member 253 slides in each guide groove 255c in the ring body 255, while the holding member 253 is rotated about the pivot pin 253b to the opposite side to the rotating direction, thereby bringing the vertical face 258d of the first holding part 258a into contact with the peripheral end face of the wafer W (see FIGS. 20A and 20B). In this state, since each holding member 253 is subjected to the elastic force F of the coil spring 256, the wafer W can be held by the fist holding part 258a certainly. Additionally, since the elastic forces F of the coil springs 256 are respectively applied on the first holding parts 258a of the holding members 253 at three positions, it is possible to accomplish the positioning of the wafer W, that is, centering of the wafer W with high accuracy. In this state, it is carried out to allow a cleaning chemical liquid to seep out of a lower supply path (not shown) onto the under plate 272. That is, by supplying the cleaning chemical liquid into a gap between the back face of the wafer W and the upper face of the under plate 272, the cleaning chemical liquid diffuses all over the back face of the wafer W, thereby forming a liquid film (membrane) of the cleaning chemical liquid in uniform contact with the back face of the wafer W. When the liquid film is formed in the whole gap in this way, the supply of the cleaning chemical liquid is brought to a standstill to clean the back face of the wafer W.

In such a situation, since the spin chuck 250 rotates the wafer W at a relatively slow speed (e.g. 10 to 30 r.p.m.) so as not to collapse a profile of the liquid film, a liquid flow is produced in the liquid film due to the rotation of the wafer W. Owing to the formation of the liquid flow, it become possible to prevent an occurrence of stagnation in the liquid film of the cleaning chemical liquid, producing an improvement in cleaning efficiency.

Simultaneously with the formation of the liquid film in the gap, it is further performed to allow the cleaning chemical liquid to debouch into the front face of the wafer W (surface of a metal film M) through the periphery of the back face of the wafer W, thereby supplying the cleaning chemical liquid up to the water's periphery (front side edge) to be removed in the subsequent process. That is, the periphery (edge) of the front face of the wafer W is cleaned at the same time of cleaning the back face.

After that, the spin chuck 250 rotates at e.g. 200 r.p.m. for five seconds. That is, this rotation causes the cleaning chemical liquid on the wafer W to be shaken off and drained to a drain pipe (not shown) of the inner cup 270. When the spin chuck 250 is rotated at a high speed, a centrifugal force C is applied on each holding member 253. Then, the holding members 253 each pivots about the pivot pin 253b to the rotating direction of the spin chuck 250, thereby brining the V-shaped face 258e of the second holding part 258b into contact with the upper and lower peripheral edges of the wafer W (FIGS. 21A and 21B). Consequently, elements for holding the periphery of the wafer W are changed from the first holding parts 258a to the second holding parts 258b while the wafer W is floating from the horizontal shoulder tongues 258f. Thus, the chemical liquid is supplied to the wafer's peripheral and lower portions that have been brought into contact with the horizontal shoulder tongues 258f of the first holding parts 258a. Additionally, since the second holding parts 258b are adapted to hold the upper and lower edges of the wafer W through the V-shaped faces 258e, it is possible to reduce a contact area of the wafer W with the holding parts 258a while increasing the wafer's contact area with the chemical liquid, whereby the cleaning efficiency can be improved. Under such a holding condition, the wafer W is subjected to cleaning, rinsing and drying processes.

After the drying process, the rotation of the spin chuck 250 is stopped. Successively, the lock mechanisms 257 are activated to engage the lock pieces 257b into the engagement holes 255b of the ring body 255, thereby locking up the rotation of the chuck body 251. In this state, the lower face of the periphery of the wafer W is held by the third holding parts 258c of the holding members 253 (see FIGS. 19A and 19B). Next, the unit-chamber mechanical shutter 244 for the substrate cleaning unit 212 and the outer-chamber mechanical shutter 246 for the outer chamber 241 open together. Then, the transporting arm enters the interior of the substrate cleaning unit 212 to receive the wafer W from the spin chuck 250 and thereafter, the wafer W is discharged from the unit 212. Since the under plate 272 is positioned in its withdrawal position during the above operation, there is defined a sufficient gap between the under plate 272 and the wafer W held by the spin chuck 250 in the same way as the loading operation. Therefore, the transporting arm can receive the wafer W from the spin chuck 250 with room.

In the above-mentioned embodiment, the substrate processing apparatus of the invention is embodied in the form of the substrate processing unit which is constructed so as to apply a resist removal process, a cleaning process, etc. on the surfaces of the semiconductor wafer. Nevertheless, the present invention is also applicable to a substrate etching unit. Further, the invention is applicable to process other substrates besides the semiconductor wafers, for example, LCD substrates.

The third embodiment of the invention will be described with reference to FIGS. 22 to 27.

Figure 22:
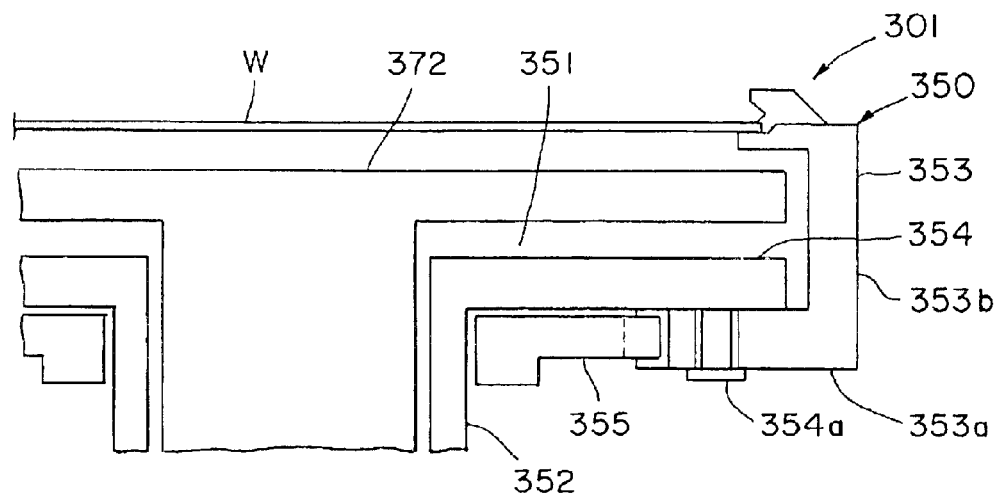
FIG. 22 is a schematic plan view showing an essential part of the spin chuck of the substrate cleaning unit in accordance with the third embodiment of the invention.
Figure 23:
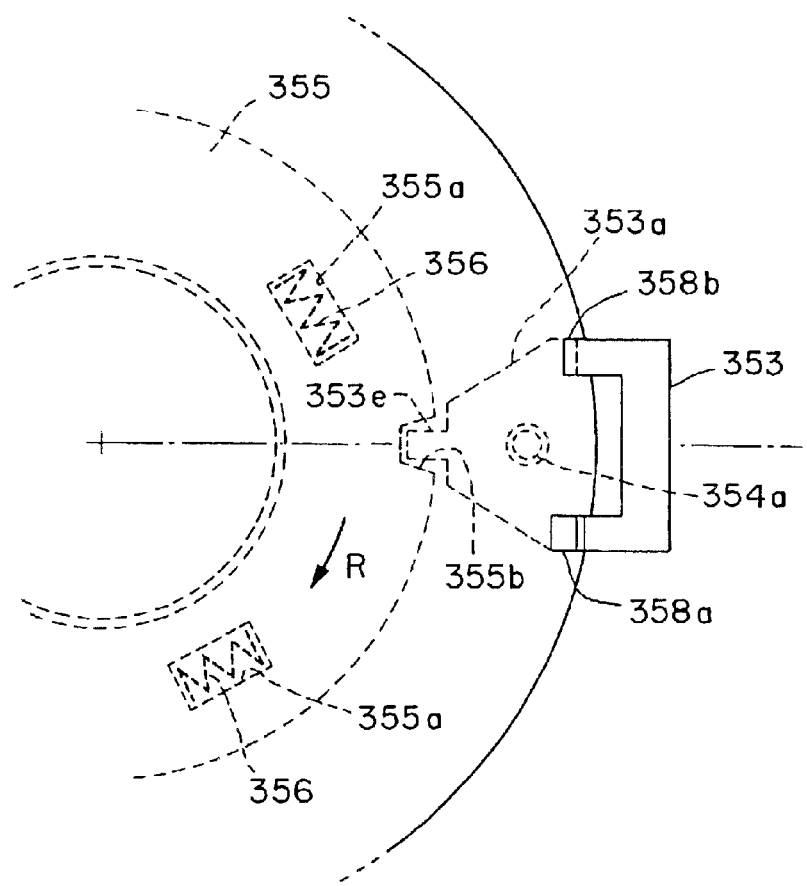
FIG. 23 is a schematic plan view of the essential part of the spin chuck of FIG. 22.
Figure 25:
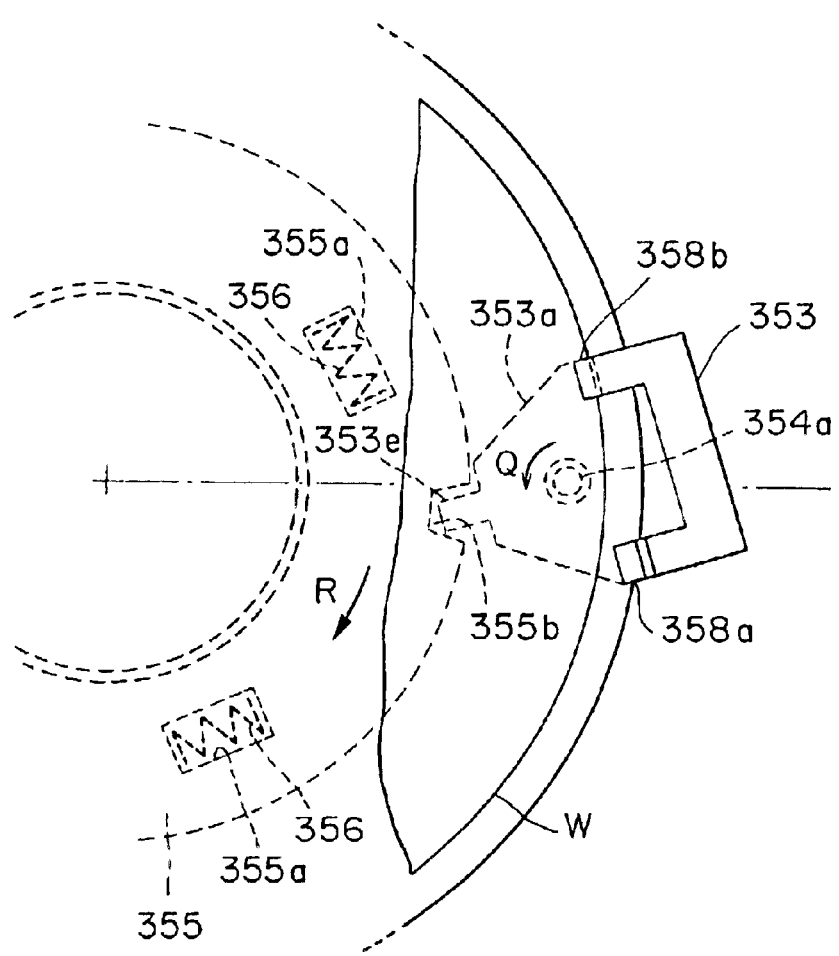
FIG. 25 is a plan view showing a second holding part projecting inward in the radial direction of the spin chuck of FIG. 23.

FIG. 22 is a sectional view of a spin chuck 350 rotatably supporting a wafer in a substrate cleaning unit 301. The spin chuck 350 includes a chuck body 351 for holding the wafer W horizontally and a rotating cylinder 352 connected with the bottom of the chuck body 251. In the chuck body 351, there is arranged an under plate 372 which is relatively movable between a position close to the back face of the wafer W held by the spin chuck 350 and another position far from the back face of the wafer W. The rotating cylinder 352 is connected with a motor through a timing belt, allowing the chuck body 351 to be rotated.

The above chuck body 351 includes a base part 354 in the form of a circular disc and a concentric-circle shaped ring body 355 rotatably mounted on the lower face of the base part 354. The ring body 355 is provided, at several positions thereof (e.g. three positions at regular intervals), with spring recesses 355a. In each spring recess 355a, there is accommodated a compressed coil spring 356 which has one end engaging with the base part 354 and the other end engaging with the ring body 355. Thus, owing to the urge of elastic forces of the coil springs 356 in the recesses 355a, the ring body 355 is adapted so as to rotate in one direction usually (a direction shown with an arrow R of FIG. 23). The ring body 355 is provided with a driving mechanism (not shown) which drives the body 355 in the opposite direction to the arrow R. Thus, the ring body 355 is adapted so as to occupy one position resulting from the body's moving in the direction of the arrow R and another resulting from the body's moving in the opposite direction to the arrow R.

The disc-shaped base part 354 is provided, at several positions in the periphery (e.g. three positions at regular intervals of 120 degrees in the circumferential direction), with holding members 353. The holding members 353 each includes a base bottom part 353a rotatable about a rotating shaft 354a and a standing part 353b standing on the part 353a. The rotating shaft 354a is formed on the lower face of an outer circumferential portion of the base part 354. On both ends of an upper end of the standing part 353a in the circumferential direction, a first holding part 358a and a second holding part 358b are formed to project inward in the radial direction, respectively. The first holding part 358a is in front of the second holding part 358b in the direction of arrow R.

Figure 26:
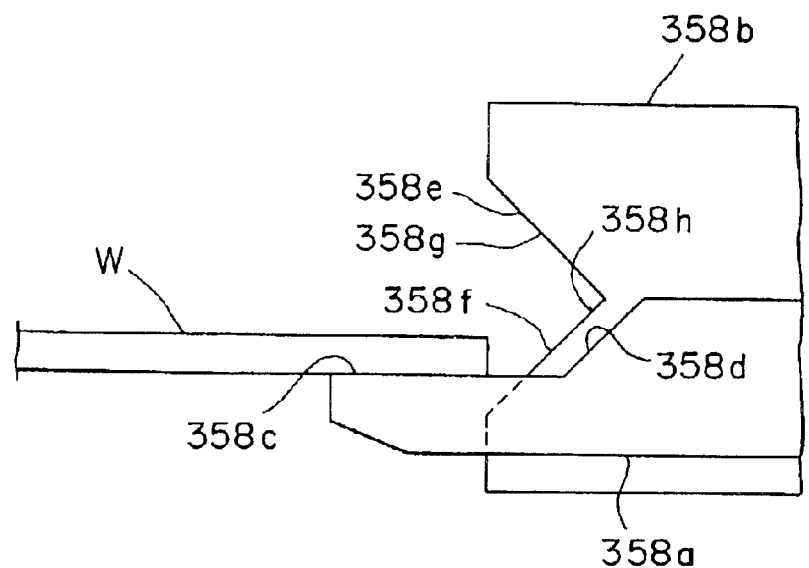
FIG. 26 is a side view showing the first holding part projecting inward in the radial direction.
Figure 27:
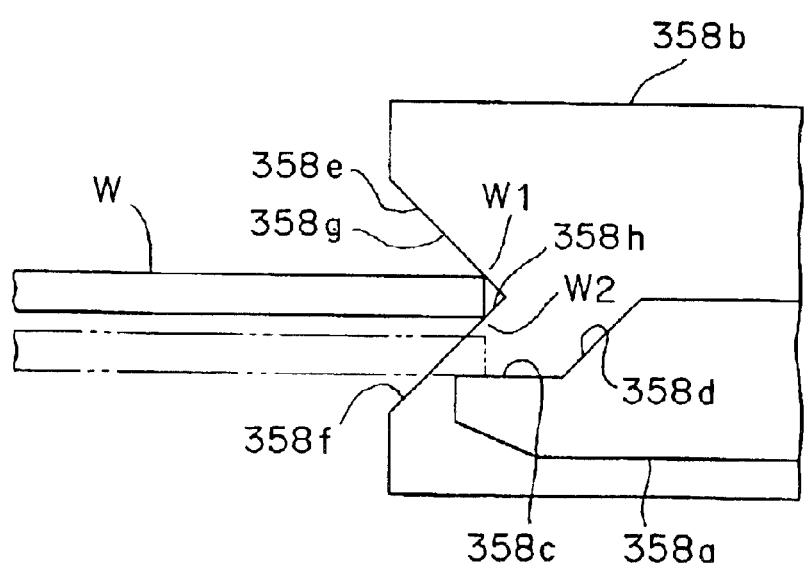
FIG. 27 is a side view showing the second holding part projecting inward in the radial direction.

As shown in FIGS. 26 and 27, the first holding part 358a is provided, on an upper side thereof, with a wafer mounting face 358c and an inclined face 358d succeeding to the face 358c. The wafer mounting face 358c is adapted so as to mount the peripheral part of the wafer W thereon. While, the second holding part 358b is provided, on an inside thereof in the radial direction, with a V-shaped wafer fitting groove 358g having two inclined faces 358e, 358f. That is, the groove 358g is adapted so that its bottompart 358h holds the peripheral edges of the wafer W.

The ring body 355 has engagement recesses 355b formed in the outer circumference. Each holding member 353 has an engagement projection 353e formed on the inside of base bottom part 353a, for engagement with the engagement recess 355b. Therefore, the rotation of the ring body 355 allows the holding members 353 to be rotated around the rotating shafts 354a respectively.

In the above-mentioned structure, when activating the driving mechanism, the ring body 355 is rotated in the opposite direction to the arrow R, in opposition to urging forces of the compression coil springs 356, as shown in FIG. 24. Correspondingly, each holding member 353 is rotated in the opposite direction to an arrow Q, through the intermediary of the engagement recess 355b and the engagement projection 353e, so that the first holding part 358a is brought to a position (first position) inside the second holding part 358b in the radial direction. In this state, the wafer W is mounted on the wafer mounting faces 358c of the first holding parts 358a of the holding members 353.

Next, when inactivating the driving mechanism, the ring body 355 is rotated in the direction of the arrow R by the urging forces of the compression coil springs 356. Correspondingly, each holding member 353 is rotated in the direction of the arrow Q, through the intermediary of the engagement recess 355b and the engagement projection 353e, so that the second holding part 358b is moved inward in the radial direction to occupy a position (second position) inside the first holding part 358a in the radial direction. Then, the periphery of the wafer W is raised along the lower inclined face 358f forming the V-shaped wafer fitting groove 358g. Subsequently, as shown in FIG. 27, the peripheral edges of the wafer W are engaged with the bottom part 358h. That is, the wafer W is held by the second holding parts 358b while being apart from the wafer mounting faces 358c of the first holding parts 358a upward. In this state, a ridgeline (upper edge) WL where the front face of the wafer W intersects the peripheral face comes into point-contact with the inclined face 358e, while another ridgeline (lower edge) W2 where the back face of the wafer W intersects the peripheral face comes into point-contact with the inclined face 358c. Therefore, owing to the point-contact form, it is possible to make the processing liquid spread the whole outer surface of the wafer W.

In the spin chuck 350 of the substrate processing unit 301, by rotating the ring body 355 by means of the driving mechanism, it is possible to rotate each holding member 353 through the engagement recess 355b and the engagement projection 353e, thereby allowing the first holding part 358a and the second holding part 358b to be projected inward in the radial direction alternately. Therefore, when loading the wafer W, the first holding parts 358a of the holding members 353 hold the wafer for the time being. Subsequently, by moving the second holding parts 358b each having the V-shaped groove inward in the radial direction, the wafer W is raised from the first holding parts 358a slightly and held by the bottoms of the V-shaped grooves of the second holding parts 358b. That is, since the holding members 353 can hold the periphery of the wafer W due to point-contact, it is possible to make the processing liquid spread the whole periphery of the wafer W, accomplishing a uniform cleaning operation.

What is claimed is:

1. A liquid processing apparatus for applying a liquid processing on a substrate by a processing liquid, comprising:
   supporting device for supporting the substrate substantially horizontally;
   holding devices substantially horizontally movable towards and away from the substrate, each holding device including a slope and a holding part;
   the slope extending upwardly as departing from the substrate to outwardly, the slope sliding with respect to the peripheral edge of the substrate when the holding device moves horizontally so as to move the substrate upwardly away from or downwardly towards the supporting device;
   the holding part for holding the substrate separated from the supporting device by the slope; and
   processing-liquid supply unit for supplying the substrate held by the holding devices with a processing liquid.

2. A liquid processing apparatus for applying a liquid processing on a substrate by a processing liquid, comprising:
   a rotary plate capable of rotation;
   a supporting member arranged on the rotary plate to substantially horizontally support the substrate at a predetermined position of the periphery of the substrate;
   a holding member arranged on the rotary plate to hold the substrate substantially horizontally;
   processing-liquid supply unit for supplying the substrate held by the holding member with a processing liquid;
   a driving mechanism for moving the holding member so that the substrate, which has been supported by the supporting member, can be held apart from the supporting member by the holding member and that the substrate, which has been held by the holding member, can be supported apart from the holding member by the supporting member; and
   a holding mechanism for holding the holding member at a predetermined position so that the substrate is held apart from the supporting member by the holding member.

3. A liquid processing apparatus as claimed in claim 2, wherein
   the holding member is provided with a claw part which holds an end face of the substrate, and
   the claw part has wall portions each inclined to the substrate with a predetermined angle, the wall portions being adapted to abut on circumferential edges of the substrate obliquely from its upside and downside respectively, in a manner that the circumferential edges of the substrate are pinched between the wall portions.

4. A liquid processing apparatus as claimed in claim 3, wherein
   the claw parts are arranged in two positions of the holding member apart from each other in a horizontal direction.

5. A liquid processing apparatus as claimed in claim 3, wherein
   the claw part is adapted so that the lower wall portion receives one of the circumferential edges of the substrate when the substrate is moved between the supporting member and the holding member, and
   the claw part is adapted so that the upper wall portion and the lower wall portion pinch the circumferential edges of the substrate when the substrate is away from the supporting member.

6. A liquid processing apparatus as claimed in claim 3, wherein
   the holding member comprises a main body formed to project from the rotary plate upward, the main body being provided, at a tip thereof, with the claw part and a base part arranged on the underside of the main body, the base part being connected with the main body;
   the holding mechanism includes a connecting member formed on a lower face of the rotary plate to connect the base part with the rotary plate so that the holding member can rotate with a predetermined angle and a spring disposed between the base part and the rotary plate to hold the holding member at a position and provide the claw part with a predetermined force for holding the substrate; and
   the driving mechanism includes a pressing member to press the base part toward the rotary plate thereby releasing the predetermined force for holding the substrate, the predetermined force being applied on the claw part by the spring.

7. A liquid processing apparatus as claimed in claim 6, wherein
   the holding member is formed to have a center of gravity in level with a rotating center of the holding member under condition that the claw part holds the substrate.

8. A liquid processing apparatus as claimed in claim 6, wherein
   the base part is provided, inside thereof, with a weight member for adjusting the position of a center of gravity of the holding member, the weight member having a specific gravity larger than a specific gravity of the other portion of the base part.

9. A liquid processing apparatus as claimed in claim 6, wherein
   the main body has side faces each tapered with a predetermined angle or curved in plan view, thereby reducing an air resistance exerted to the main body when the rotary plate is rotated.

10. A liquid processing apparatus as claimed in claim 2, wherein
    the supporting member includes a supporting part for contact with the back face of the substrate and a wall part having a predetermined height to guide a circumferential end face of the substrate supported by the supporting part; and
    the holding member is adapted so as to hold the substrate in a position where the back face of the substrate is away from the supporting part of the supporting member and where a level of the back face of the substrate is lower than the top of the wall part of the supporting member.

11. A liquid processing apparatus as claimed in claim 2, wherein
    the rotary plate is provided, in a periphery thereof and at positions about the periphery, with notches in which the supporting member and the holding member are provided.

12. A liquid processing apparatus as claimed in claim 2, further comprising:
    a first plate arranged apart from the back face of the substrate in a predetermined distance so as to be substantially parallel with the back face of the substrate held by the holding member; and
    a second plate which is movable up and down thereby occupying a position where the second plate is arranged apart from the front face of the substrate in a predetermined distance so as to be substantially parallel with the front face of the substrate held by the holding member,
    wherein the processing-liquid supply unit can supply the processing liquid into a clearance defined between the first plate and the back face of the substrate and another clearance defined between the second plate and the front face of the substrate.

13. A liquid processing apparatus for applying a liquid processing on a substrate by a processing liquid, comprising:
- a rotary plate capable of rotation;
- a holding-member body arranged on an outer periphery of the rotary plate, the holding-member body being rotatable about a rotating shaft in parallel with a rotating shaft of the rotary plate;
- a supporting part provided in the holding-member body to support the substrate at a predetermined position of a peripheral part of the substrate substantially horizontally;
- a pressing part provided in the holding-member body to press the outer periphery of the substrate supported by the supporting part inward in a radial direction thereof;
- a holding part provided in the holding-member body to hold the outer periphery of the substrate substantially horizontally;
- a processing-liquid supplying unit for supplying the substrate held by the holding part with a processing liquid;
- a fixing mechanism for fixing the holding-member body in a predetermined position so as to allow the substrate to be supported by the supporting part;
- an urging mechanism for rotating the holding-member body so that when releasing the fixing mechanism, the pressing member can press the substrate while the substrate is being supported by the supporting part; and
- a centrifugal weight for rotating the holding-member body by means of a centrifugal force so as to make the pressing part withdraw from the outer periphery of the wafer, make the holding part to engage with the outer periphery of the wafer and support the substrate being away from the supporting part.

14. A liquid processing apparatus for applying a liquid processing on a substrate by a processing liquid, comprising:
- a rotary plate capable of rotation;
- a holding-member body arranged on an outer periphery of the rotary plate, the holding-member body being rotatable about a rotating shaft in parallel with a rotating shaft of the rotary plate;
- a supporting part provided in the holding-member body to support the substrate at a predetermined position of a peripheral part of the substrate substantially horizontally;
- a holding part provided in the holding-member body to hold the substrate substantially horizontally;
- a processing-liquid supplying unit for supplying the substrate held by the holding part with a processing liquid;
- a driving mechanism for rotating the holding-member body so that the substrate that has been held by the holding part is supported by the supporting part while the substrate is being away from the holding part; and
- an urging mechanism for rotating the holding-member to a predetermined position so that the substrate that has been supported by the supporting part is held by the holding part while the substrate is being away from the supporting part.

15. A liquid processing apparatus as claimed in claim 13 or 14, wherein
- a position to allow the supporting part to support the substrate is higher than another position to allow the holding part to hold the substrate.

16. A liquid processing apparatus as claimed in claim 13 or 14, wherein
- the holding part has a groove formed to have a V-shaped section defined by two inclined faces; and
- the substrate is held in a manner that a ridgeline where the upper face of the substrate intersects the outer circumferential face of the substrate and another ridgeline where the lower face of the substrate intersects the outer circumferential face of the substrate come into contact with the inclined faces of the holding part, respectively.

17. A liquid processing method of applying a liquid processing on a substrate, the method comprising:
- a first process to allow a supporting device to support the substrate substantially horizontally;
- a second process to allow a slope of a holding device to move substantially horizontally towards the substrate while the slope slides with respect to the peripheral edge of the substrate so as to move the substrate upwardly away from the supporting device;
- a third process to allow a holding part of the holding device to hold the substrate separated from the supporting device by the slope
- a fourth process to allow a processing-liquid supply unit to supply the substrate held by the holding device with a processing liquid.

18. A liquid processing method of applying a liquid processing on a substrate, the method comprising:
- a first process to allow a supporting member for supporting the substrate to support the substrate substantially horizontally;
- a second process to allow a holding member for holding the substrate to hold the substrate substantially horizontally while the substrate is being away from the supporting member;
- a third process to arrange a plate member so as to be substantially parallel with the back face of the substrate held by the holding member, at a predetermined distance;
- a fourth process to supply a gap between the back face of the substrate held by the holding member and the plate member with a processing liquid; and
- a fifth process to rotate the substrate held by the holding member, at a predetermined rotating speed,
- thereby restraining an occurrence of unprocessed portions on the substrate, which might be caused since the supporting member abuts on the back face of the substrate.

19. A liquid processing method as claimed in claim 18, wherein the fourth process includes the steps of:
- forming a paddle of the processing liquid between the back face of the substrate held by the holding member and the plate member; and
- retaining the paddle therebetween for a predetermined period.

20. A liquid processing method as claimed in claim 19, wherein
- the third process further includes the step of arranging another plate member so as to be substantially parallel with the front face of the substrate held by the holding member, at a predetermined distance; and
- the fourth process further includes the step of supplying a gap between the front face of the substrate held by the holding member and the other plate member with a processing liquid.

* * * * *